(12) United States Patent
Liboiron-Ladouceur et al.

(10) Patent No.: US 9,281,902 B2
(45) Date of Patent: Mar. 8, 2016

(54) METHODS AND SYSTEMS FOR OPTICAL RECEIVERS

(71) Applicant: The Royal Institution for the Advancement of Learning/ McGill University, Montreal (CA)

(72) Inventors: Odile Liboiron-Ladouceur, Montreal (CA); Meer Nazmus Sakib, Montreal (CA)

(73) Assignee: The Royal Institution for the Advancement of Learning/ McGill University, Montreal (CA)

( * ) Notice: Subject to any disclaimer, the term of this patent is extended or adjusted under 35 U.S.C. 154(b) by 181 days.

(21) Appl. No.: 13/869,145

(22) Filed: Apr. 24, 2013

(65) Prior Publication Data

US 2013/0294782 A1 Nov. 7, 2013

Related U.S. Application Data

(60) Provisional application No. 61/637,314, filed on Apr. 24, 2012.

(51) Int. Cl.
| | | |
|---|---|---|
| H04B 10/06 | (2006.01) | |
| H04B 10/61 | (2013.01) | |
| H03M 13/45 | (2006.01) | |
| H03M 13/11 | (2006.01) | |

(52) U.S. Cl.
CPC ......... *H04B 10/616* (2013.01); *H03M 13/1111* (2013.01); *H03M 13/458* (2013.01)

(58) Field of Classification Search
None
See application file for complete search history.

(56) References Cited

U.S. PATENT DOCUMENTS

| | | | | |
|---|---|---|---|---|
| 6,515,987 | B1* | 2/2003 | Carrozza et al. | 370/366 |
| 6,704,545 | B1* | 3/2004 | Wala | 455/16 |
| 2004/0146119 | A1* | 7/2004 | Weiner et al. | 375/317 |
| 2006/0136797 | A1* | 6/2006 | Cai et al. | 714/752 |
| 2009/0269081 | A1* | 10/2009 | Cai et al. | 398/202 |

OTHER PUBLICATIONS

Tomizawa et al., "Error correction without additional redundancy by novel optical receiver with diverse detection", 2002, OFC 2002, pp. 368-370.*

\* cited by examiner

*Primary Examiner* — Ken Vanderpuye
*Assistant Examiner* — David Lambert
(74) *Attorney, Agent, or Firm* — The Law Office of Michael E. Kondoudis

(57) ABSTRACT

Broadband access networks are driving the upgrade of DWDM networks from 10 Gb/s per channel to more spectrally-efficient 40 Gb/s or 100 Gb/s. Signal quality degradation due to linear and non-linear impairments are significant and error control coding and signal processing solutions play increasingly key roles in meeting increasing demand, providing improved quality of service, and reduced cost. It would be beneficial to reduce the power consumption of optical receivers for optical links exploiting for example LPDC encoding. Accordingly, the inventors have established a low complexity soft-decision front-end compatible with deployable LDPC codes in next-generation optical transmission systems. Beneficially the optical receiver design can be retro-fitted into deployed hard-decision based optical systems and replaces the 3-to-2 encoder of the prior art in the electrical portion of the receiver with a single gate design. Further, the design may act as a 2-bit Flash ADC in multimode fiber based optical receivers.

9 Claims, 13 Drawing Sheets

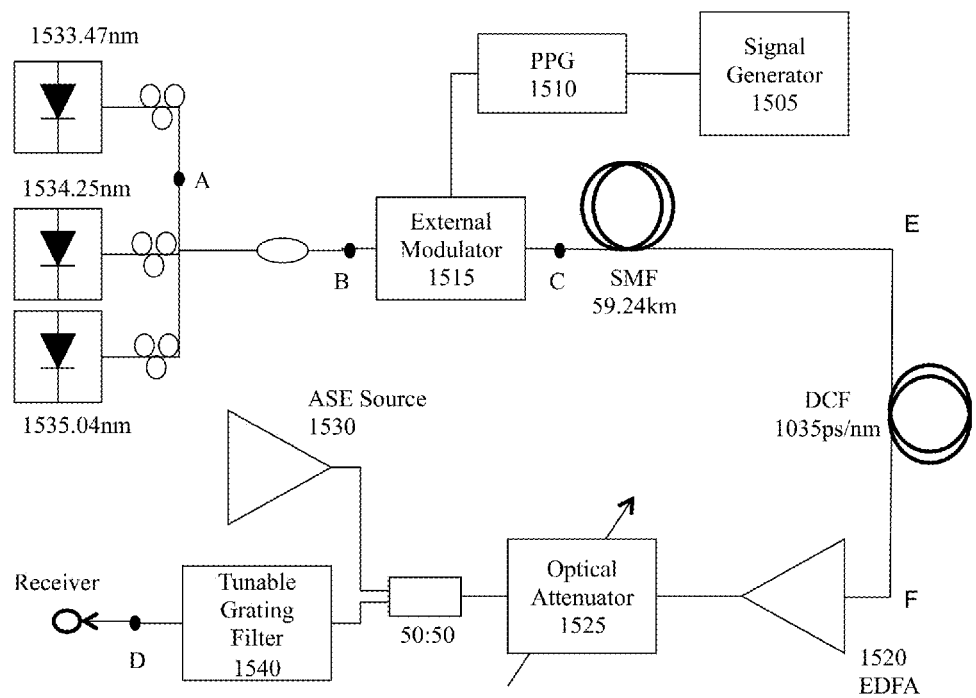
Figure 15A
Figure 15B
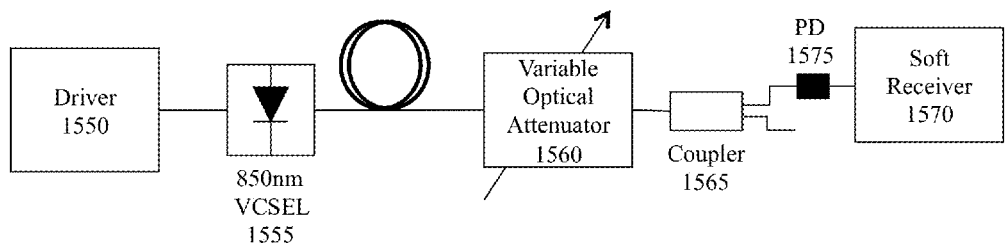

METHODS AND SYSTEMS FOR OPTICAL RECEIVERS

CROSS-REFERENCE TO RELATED APPLICATIONS

This patent application claims the benefit of U.S. Provisional Patent Application 61/637,314 filed Apr. 24, 2012 entitled "Method and System for Optical Receivers", the entire contents of which are included by reference.

FIELD OF THE INVENTION

The present invention relates to optical receivers and more specifically low complexity optical receivers for decoding encoded data.

BACKGROUND OF THE INVENTION

The rapid growths of data-centric services such as Internet video and social media are changing our lives and the way society communicates. Today with the initial expansion of these services and their requirement for general deployment of broadband access networks they are already driving the upgrade of dense wavelength division multiplexing (DWDM) networks from 10 Gb/s per channel to more spectrally-efficient 40 Gb/s or 100 Gb/s. With the anticipated growth of digital media globally, approximately $2.2 trillion over the next five years (see for example "Ultrafast Networks Gear Up for Deployment" (Nat. Photonics., Vol. 4, pp. 144), today's demand for broadband connectivity is driven by necessity, not luxury. To achieve sustainable economical growth around the world it is important to make sure the cost of the Internet is as low as possible, both in price and energy. This requires the development of a low cost energy efficient Terabit per second (Tbps) communication infrastructure with only optical fiber technology able to handle multi-Terabits per second of data effectively. Hence, an increase in data rates to 400 Gbps-1 Tbps in next-generation optical communication systems has become inevitable. In such systems, data integrity is stressed by physical layer impairments, i.e. chromatic dispersion, polarization mode dispersion and nonlinearity in the optical fiber. Advanced forward error-correction (FEC) technologies in optical links offer one of the most cost-effective methods to combat system impairments, increase the data rate, and extend its reach. Accordingly, techniques and technologies that enable the development of power efficient FEC decoders become important and beneficial.

Current optical networks employ forward error-correction (FEC) based on classical error-correcting codes such as Reed-Solomon (RS) or Bose-Chaudhuri Hocquenghem (BCH) codes, see for example Tychopoulos et al "FEC in Optical Communications—A tutorial overview on the evolution of architectures and the future prospects of outband and inband FEC for optical communications" (IEEE Circuits and Devices Mag., Vol. 22, No. 6, pp. 79-86) and ITU-T Recommendation G.975.1, "Series G: Transmission Systems and Media, Digital Systems and Networks, Digital sections and digital line system—Optical fibre submarine cable systems: Forward error correction for high bit-rate DWDM submarine systems" (ITU 2006). Both RS and BCH codes currently use hard-decision based receivers that have limited coding gain.

Since the re-discovery of iteratively decodable error-correcting codes performing very close to the Shannon capacity limit, wireless communications has been realigned to use these new powerful classes of codes including turbo codes and low-density parity-check (LDPC) codes see for example Gallager "Low-density parity-check codes" (IRE Trans. on Inf. Theory, Vol. 8, No. 1, pp. 21-28), Gallager "Low density parity check codes" (Ph.D. Dissertation, MIT Press, Cambridge, Mass., 1963), Berrou et al "Near Shannon Limit Error-Correcting Coding and Decoding: Turbo-Codes" (Proc. of IEEE Intl. Conf. on Comm., ICC 1993, Vol. 2, pp. 1064-1070), and Chung et al "On the design of low-density parity-check codes within 0.0045 dB of the Shannon limit" (IEEE Comm. Lett., Vol. 5, No. 2, pp. 58-60).

Although LDPC codes were invented by Gallager in 1962, they were widely overlooked until the 1990s, see Berrou, Chung, Tanner "A recursive approach to low complexity codes" (IEEE Trans. Inform. Theory, Vol. 27, No. 5, pp. 533-547) and Zyavlov et al "Estimation of the error-correction complexity of Gallager low density codes" (Probl. Pered. Inform., Vol. 11, No. 1, pp. 23-26). With the recent substantial increases in computing power, LDPC codes have generated great interest in the wireless community. Following this new paradigm, LDPC codes which use soft-decisions have been proposed for optical communication systems to mitigate the challenging optical channel impairments in the next-generation optical communication systems, see Vasic et al "Low-Density Parity Check Codes for Long Haul Optical Communications Systems" (IEEE Photon Tech. Lett., Vol. 14, No. 8, pp. 1208-1210) and Djordjevic et al "Low-Density Parity-Check Codes for 40-Gb/s Optical Transmission System" (IEEE J. of Sel. Topics in Quant. Electron., Vol. 12, No. 4, pp. 555-562, hereinafter Djordjevic1). The performance of different classes of LDPC codes has been assessed extensively through simulation taking into account certain major transmission impairments such as inter-channel and intra-channel nonlinearities, stimulated Raman scattering, group-velocity dispersion, optical amplifier noise, filtering effect and channel cross-talk, see Djordjevic. Results showed that LDPC codes can be an extremely effective solution for high speed optical systems achieving coding gain of as high as 11 dB and 5 dB over an uncoded and RS(255,239) based optical systems respectively, see Djordjevic et al "Next Generation FEC for High-Capacity Communication in Optical Transport Networks (Invited)" (IEEE J. of Lightwave Tech., Vol. 27, No. 16, pp. 3518-3530, hereinafter Djordjevic2).

LDPC codes can be very powerful, but their practical implementation for high data rate optical communications remains a challenge due to the complex structure of the decoder. Recently Tehrani et al "Relaxation dynamics in stochastic iterative decoders" (IEEE Trans. Signal Process., Vol. 58, No. 11, pp. 5955-5961) and Mohsenin et al "A low-complexity message passing algorithm for reduced routing congestion in LDPC decoders" (IEEE Trans. Circuits Syst. I, Reg. Papers, Vol. 57, No. 5, pp. 1048-1061) have reported work considering simplified decoder structures to enable the same performance. Most prior art and current research activities related to LDPC algorithms for optical communication are mostly focused on simulation studies with a few experimental demonstrations. Examples of such prior art include Mizuochi et al "Experimental demonstration of concatenated LDPC and RS codes by FPGAs emulation" (IEEE Photon Tech. Lett., Vol. 21, No. 18, pp. 1302-1304); Kobayashi et al "Soft-decision LSI operating at 32 Gsample/s for LDPC FEC-based optical transmission systems" (Proc. OFC and NFOEC, pp. 1-3, Paper OWE2, 2009); Onohara et al "Soft-decision FEC for 100G transport systems," (Proc. OFC and NFOEC, pp. 1-3, Paper OThL1, 2010); Miyata et al "A Triple-Concatenated FEC Using Soft-Decision Decoding for 100 Gb/s Optical Transmission" (Proc. OFC and NFOEC, pp. 1-3, Paper OThL3, 2010); Masalkina et al "Soft-FEC Implementation for High-Speed Coherent Optical OFDM Systems"

(Proc. 2010 ITG Symposium on Photonic Networks, Paper ITG-FB 222); and Yang et al in "428-Gb/s single-channel coherent optical OFDM transmission over 960-km SSMF with constellation expansion and LDPC coding" (Opt. Express, Vol. 18, No. 16, pp. 16883-16889). In Mizuochi, Kobayashi, Onohara, and Miyata a novel soft-decision all electrical front-end for a receiver was demonstrated where the soft-decision bits are provided by a 3-to-2 encoder. However, the soft-decision circuit consumed alone 14 W at 32 GS/s.

Amongst the challenges is that the decoding of the code requires soft-decision bits or multiple level of information about the received bits. Conventionally, optical communication systems rely on a hard-decision approach where the information about the received bits consist of only one bit, either a digital "1" or "0" was received. On the other hand, a 2-bit soft decision decoder requires $2^2-1=3$ decision levels where the middle level is a bit corresponding to the hard-decision digit and the other two levels indicate the probability or confidence regarding the hard-decision, e.g. the received bit is certainly a "0" or maybe a "0" based on noise level or other physical layer impairments. As demonstrated by Kobayashi and Onohara the 32 GS/s 2-bit soft-decision circuit for LDPC decoders yielded a net coding gain (NCG) of 9.3 dB achieved at 126.4 Gb/s by combining four soft-decision circuits.

Recently, the inventors in Sakib et al in "Optical Front-End for Soft-Decision LDPC Codes in Optical Communications" (J. Opt. Comm. Net., Vol. 3. pp. 533-541, hereinafter Sakib1) have demonstrated a low complexity and energy efficient optical front-end for soft-decision decoder. The proposed front-end operating at 12.5 Gb/s consumed 5 W of power with NCGs of 2.75 and 6.73 dB at BERs of $10^{-4}$ and $10^{-9}$ respectively. Within this specification this concept as well as its extension to a 45 Gb/s optical front-end is presented. Optical receiver design according to embodiments of the invention is implemented by tapping the incoming optical signal prior to the photodetector and using an exclusive-nor (XNOR) gate. The receiver architecture is simplified by using a passive optical power divider instead of active electrical fan-out buffers and it is also shown that the soft-decision front-end can be used as a 2-bit flash analog-to-digital converter (ADC) for use with digital equalizers, for example, also making the receiver design suitable for systems requiring digital post-processing. For singlemode erbium doped fiber amplifier (EDFA) based optical systems, the noise distribution is Chi-Squared and symmetric Gaussian for direct detection and coherent receivers, respectively. However, within the context of multimode links the inventors refer to the concept of "flash ADC" for receivers as multimode links can be modeled as systems with additive Gaussian noise and symmetric Gaussian amplitude distribution such that the received optical signal can be equalized with digital equalizers. A flash ADC is a simple form of an ADC in which the input voltage to the ADC is divided into multiple levels to several comparators or limiting amplifiers enabling higher speed by parallelizing the digitization process. The outputs of these comparators are fed to a binary encoder that gives the digitized bits. Accordingly, the inventors have established that a soft-decision front-end may essentially perform the desired a flash ADC.

It would be as discussed supra be beneficial to reduce the power consumption of optical receivers for optical links exploiting LPDC encoding. Accordingly, the inventors have established a low complexity soft-decision front-end which is compatible with deployable LDPC codes in next-generation optical transmission systems. Beneficially the optical receiver design can be retro-fitted into deployed hard-decision based optical systems through the additional of a passive optical tap prior to the photodetector allowing the soft-decision front-end to be added in parallel thereby minimizing the additions to the optical infrastructure. Additionally the invention replaces the 3-to-2 encoder of the prior art in the electrical portion of the receiver with a single gate design. With the lowest cost short optical links operating at multi-Gigabit rates being multimode based it would be further beneficial for receivers in such links to exploit flash ADC techniques for improved performance.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to optical receivers and more specifically low complexity optical receivers for decoding encoded data.

In accordance with an embodiment of the invention there is provided a method comprising:
providing a soft decision circuit receiving a first predetermined portion of the optical signal received at a node, the soft decision circuit generating a confidence level in dependence upon the received optical signal;
providing a hard decision circuit receiving a second predetermined portion of the optical signal received at the node, the hard decision circuit generating a decision in dependence upon the received optical signal; and
combining the confidence level and decision in a decision circuit to establish an output.

In accordance with an embodiment of the invention there is provided a method comprising:
a soft decision circuit receiving a first predetermined portion of the optical signal received at a node, the soft decision circuit generating a confidence level in dependence upon the received optical signal;
a hard decision circuit receiving a second predetermined portion of the optical signal received at the node, the hard decision circuit generating a decision in dependence upon the received optical signal; and
a decision circuit combining the confidence level and decision to establish an output result.

In accordance with an embodiment of the invention there is provided a device comprising:
a photodetector receiving an optical signal comprising data encoded according to a predetermined standard;
an amplifier receiving the converted optical signal from the photodetector and generating an amplified received signal;
a fan-out buffer for receiving the amplified received signal and generating a plurality of buffered signals, each buffered signal representative of the amplified received signal;
a plurality of comparators, each comparator receiving a buffered signal of the plurality of buffered signals and generating a confidence level in dependence upon the buffered signal of the plurality of buffered signals and a predetermined threshold value; and
a logic circuit receiving the plurality of confidence levels from the plurality of comparators and generating a result in dependence thereof.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 15A is a singlemode fiber based transmission link for testing a decision circuit according to an embodiment of the invention such as depicted in FIG. 14A;

FIG. 15B is a multimode fiber based transmission link for testing a decision circuit according to an embodiment of the invention such as depicted in FIG. 14A;

DETAILED DESCRIPTION

Figure 1A:
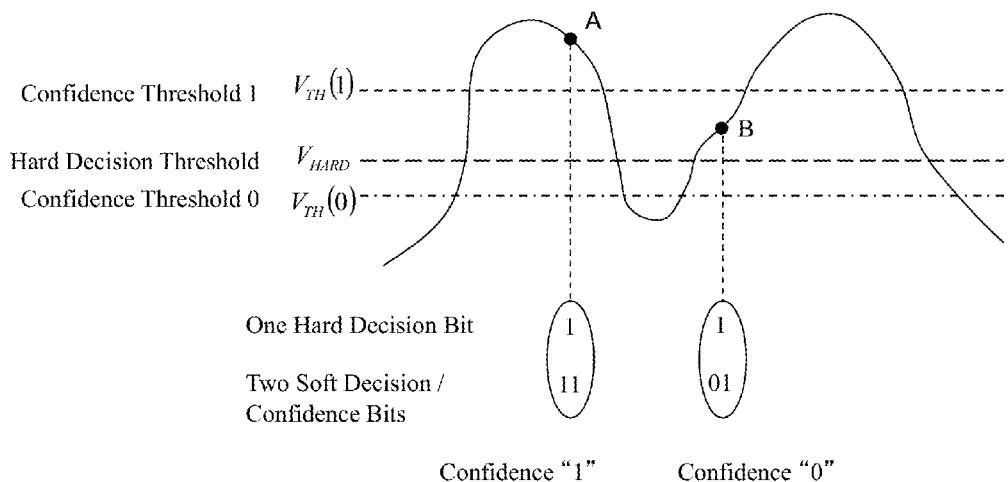
FIG. 1A depicts a physical interpretation of the soft-decision thresholds.

The present invention is directed to optical receivers and more specifically low complexity optical receivers for decoding encoded data.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Conventional direct-detection receivers provide one bit of information for each received optical "bit" corresponding to a hard-decision at the optimum decision threshold of the receiver. The receiver consists of a photodiode followed by a transimpedance amplifier (TIA) and a limiting amplifier. The limiting amplifier digitizes the analog signal from the TIA which is an electrically amplified reproduction of the optical signal. Most of the advanced error correction codes such as LDPC require soft-decision decoding which involve generating and using more than one bit of information for each received "bit". The additional bits provide a confidence level of the digitized hard-decision. One approach in the prior art is to maintain the analog converted signal and replace the limiting amplifier with a 2-3 bit soft-decision circuit that will provide the desired confidence levels. This solution has been proposed for example by Chang et al "Forward error correction for 100 G transport networks" (IEEE Comm. Mag., Vol. 48, No. 3, pp. S48-S55) and Mizuochi "Recent progress in forward error correction and its interplay with transmission impairments" (IEEE J. of Sel. Topics in Quant. Electron., Vol. 12, No. 4, pp. 544-554). For an N-bit soft-decision $2^N-1$ decision thresholds are required.

Optical Versus Electrical Soft-Decision Considerations

For a soft-decision based front-end, a linear response is required to enable the optimization of the multiple threshold levels. Optical receivers for communication conventionally use limiting amplifiers with nonlinear response since hard-decision uses only one single threshold set approximately in the middle of the dynamic range. The proposed optical front-end provides a number of advantages in terms of linearity, bandwidth, optoelectronic integration, power consumption and cost when compared to existing soft-decision front-ends, see Kobayashi and Onohara for example. The soft-decision LDPC decoders use the logarithm of the signal-to-noise ratio (SNR) for error correction. The nonlinearity limit of the front-end will impact the signal probability distribution, and thus the relationship between SNR and the bits in error processed by the decoder which relies on a linear relationship. In such case, the noise distribution can no longer be modeled by simple equations upon which the decoder operates, see Berrou for example. It will adversely affect the decoder's performance requiring complex nonlinear equalization of LDPC codes, see for example Djordjevic2. Since the photodetectors can have a linear response even for input optical power levels as high as +10 dBm, fanning out optically will satisfy the linearity requirements. The optical fan-out approach also offers a larger front-end bandwidth for opto-electronic integration as optical devices have a larger bandwidth than the electronic counterpart. For example Guckenberger et al in "Advantages of CMOS Photonics for Future Transceiver Applications" (Proc. 36th ECOC, Paper Tu.4.C.2, pp. 1-6, 2010) showed that the 130 μm CMOS compatible silicon on insulator (SOI) technology uses electronics with bandwidth of 7-10 GHz compared to 18-25 GHz for the photodetectors. Further, photodetectors exhibit a smooth roll off characteristics near their 3-dB cutoff region such that the received signal can be equalized using finite impulse response (FIR) filters after the front-end. Beneficially, a front-end requires fewer active devices when the fan-out is performed using passive optical devices (i.e. one optical splitter) instead of an electrical buffer leading to potentially less power consumption and lower cost.

Soft-Decision Optical Front-End Architecture

Referring to FIG. 1A there is depicted an example of a 2-bit soft-decision where two additional confidence thresholds are placed on both sides of the optimum, and convention prior art, hard-decision threshold. At point 'A' the received signal amplitude is above the hard-decision level as well as above both confidence threshold levels. As a result, the hard-decision achieved is '1' with a confidence level of '1'. On the contrary, at point 'B' although the hard-decision threshold is still '1' the upper confidence threshold is '0' and overall confidence will be '0'. The truth table formulated for this approach is presented in Table I where the confidence bit is '1' if the two soft-decisions are the same and '0' if they are not the same, see Kobayashi.

Kobayashi demonstrated that after electrically fanning out the output of the photodetector to four drivers, a 3-to-2 encoder can be used to implement the truth table, see Table 1 below, to provide a soft-decision for LDPC decoders. However, the inventors have established an approach wherein the soft-decision is extracted prior to the optical receiver in a conventional optical system and use it to determine the confidence levels. Such an approach being depicted in FIG. 2 wherein a passive optical coupler is used in determining the hard-decision and confidence levels. It would be evident that the optimum coupling ratio and threshold conditions may result in a tradeoff between coding gain and power penalty.

TABLE 1

Logic Table for Hard and Soft-decision

| Hard Decision Threshold $V_H$ | Upper Threshold $V_{TH}(1)$ | Lower Threshold $V_{TH}(0)$ | Hard Decision Bit $V_H$ | Confidence Bit $V_{CONF}$ |
|---|---|---|---|---|
| 1 | 1 | 1 | 1 | 1 |
| 1 | 0 | 1 | 1 | 0 |
| 0 | 0 | 1 | 0 | 0 |
| 0 | 0 | 0 | 0 | 1 |

From Table 1 the output of the encoder that provides the confidence of the received bit can be given by Equation 1 below where $V_{CONF}$, $V_{TH1}$, and $V_{TH0}$ are the output of the soft-decision circuit, upper and lower comparators, respectively. $\oplus$ and $\overline{()}$ denote binary exclusive- or (XOR) and inverse operations respectively.

$$V_{CONF} = \overline{V_{TH1} \oplus V_{TH1}} \quad (1)$$

Therefore, it is quite clear from Equation (1) that the 3-to-2 encoder functionality of the prior art may be simplified and implemented using a single high speed exclusive-nor (XNOR) gate. This is also shown schematically in FIG. 1B wherein the probability distribution functions (PDF) for the "1" and "0" logic bits are depicted relative to the hard decision threshold ($V_H$), upper threshold ($V_{TH}(1)$ or $V_{TH1}$) and lower threshold ($V_{TH}(0)$ or $V_{TH0}$). The proposed scheme requires no modification of the current direct detection optical infrastructure, $V_H = V_{HARD}$, and provides the possibility of using it as a flash type ADC in systems requiring digital equalizers.

Figure 2:
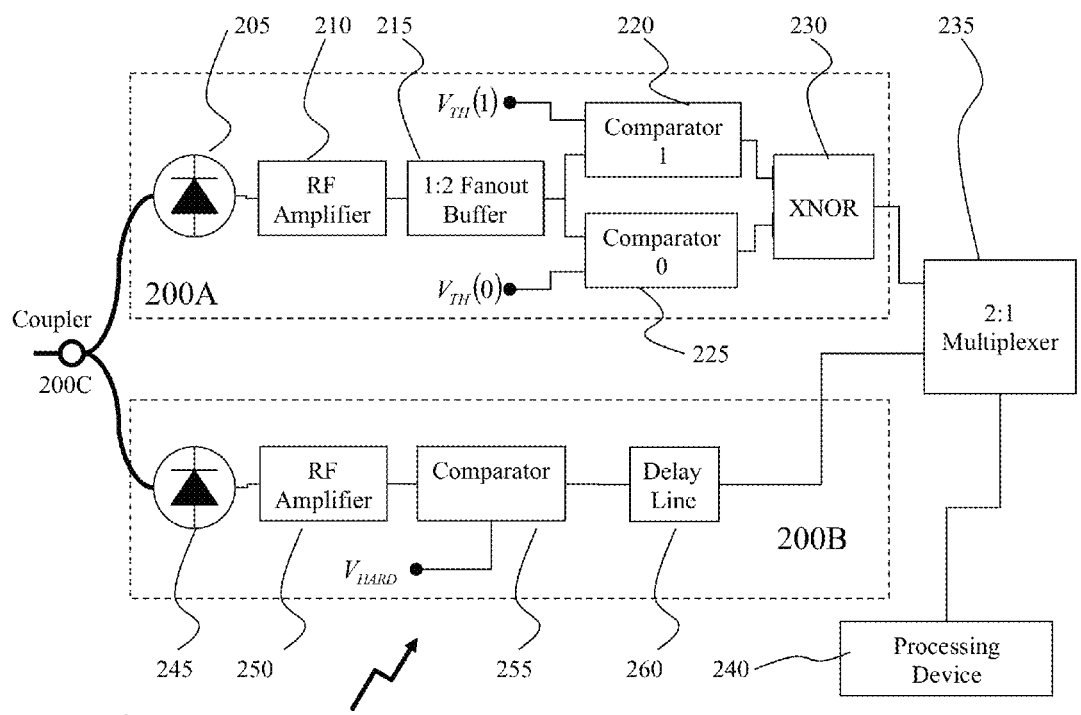
FIG. 2 depicts a low complexity soft-decision circuit according to an embodiment of the invention wherein the received optical power is split to parallel configured hard-decision and soft-decision circuits.

Referring to FIG. 2 a soft-hard circuit 200 is depicted. Soft-hard circuit 200 comprises a passive optical coupler 200C which is coupled to the optical network to receive transmitted LPDC encoded signal. Passive optical coupler 200C splits the received signal such that X % is coupled to hard decision receiver 200B and (1−X) % to soft decision receiver 200A. Hard decision receiver 200B comprises first photodetector 245 and first RF amplifier 250 that convert the optical signal to the electrical domain and amplify it wherein the amplified electrical signal is then coupled to first comparator 255 which compares the amplified electrical signal to the hard threshold, $V_{HARD}$. The resulting digitized output from the first comparator 255 is then coupled to a delay line 260 prior to be coupled to 2:1 Multiplexer 235 and therein to the processing device 240. Soft decision receiver 200A comprises second photodetector 205 and second RF amplifier 210 that convert the optical signal to the electrical domain and amplify it wherein the amplified electrical signal is then coupled to 1:2 fan-out buffer 215. One output from the 1:2 fan-out buffer 215 is coupled to first comparator 225 and the other output from the 1:2 fan-out buffer 215 is coupled to second comparator 220. First and second comparators 225 and 220 compare the amplified electrical signal to first and second thresholds $V_{TH}(0)$ and $V_{TH}(1)$ respectively. The resulting digital outputs from the first and second comparators 225 and 220 are coupled to XNOR gate 230 wherein the output of the XNOR operation is coupled to the 2:1 multiplexer 235.

12.5 Gb/s Optical Soft-Decision Front End Implementation and Experimental Results Referring to FIG. 2 an initial implementation for a soft-decision circuit 200 operating at 12.5 Gb/s was implemented and experimentally tested using discrete electronic components. The main building blocks employed were:
- first and second RF amplifiers 245 and 210 respectively;
- 1:2 fan-out buffer 215, such as Hittite Microwave Corporation HMC744 Fast Rise Time 1:2 Fanout Buffer for example;
- high speed first and second comparators 225 and 220, such as Analog Devices ADCMP572 Ultrafast 3.3 V Single-Supply Comparator w/CML Output Drivers for example;
- XNOR gate 230, such as Hittite Microwave Corporation HMC745 Fast Rise Time XOR/XNOR; and
- high speed 2:1 Multiplexer 235, such as Hittite Microwave Corporation HMC854 28 Gbps 4:1 Mux with Programmable Output Voltage.

The optically divided signal is photodetected and amplified using low noise RF amplifiers with noise figure of 2.5 dB and gain of 26 dB for the first and second RF amplifiers 245 and 210 respectively. The photodetector employed was an u2t Photonics photodetector with an RF bandwidth of 100 GHz and responsivity of 0.6 A/W. A tunable attenuator was inserted after the second RF amplifier 210 within soft decision receiver 200A to maintain the input voltage to 320 mVp-p at the input of the 1:2 fan-out buffer 215. The signal from the 1:2 fan-out buffer 215 is fed into the first and second comparators 225 and 220. The first and second comparators 225 and 220 provide the upper and lower confidence levels, respectively. The upper and lower threshold values $V_{TH}(1)$ and $V_{TH}(0)$ within the experiments were tuned with precision power supplies with a tuning resolution in the order of 1 mV.

Figure 3:
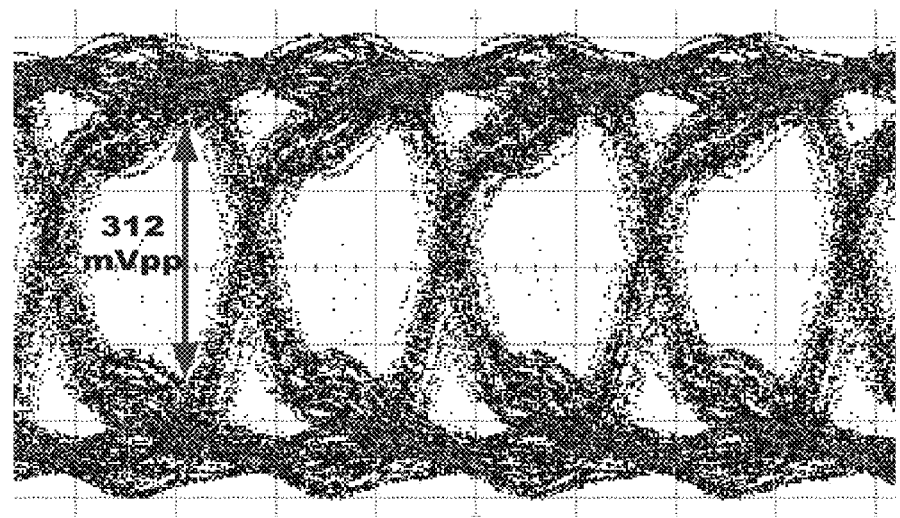
FIG. 3 depicts an output electrical eye of a soft-decision circuit as depicted in FIG. 2 according to an embodiment of the invention operating at 12.5 Gb/s.

The outputs of the first and second comparators 225 and 220 are fed into the XNOR gate 230 provides the confidence level of the received bit. The output eye of the soft-decision circuit 200 operating at 12.5 Gb/s with the circuit elements discussed above is presented in FIG. 3. Whilst some reflection can be seen in the rise and fall times of the signal, the eye opening is good (312 mVp-p). Finally, the hard-decision and soft-decision are combined using a high speed 2:1 Multiplexer 235. Experiment results are presented below in respect of FIGS. 5A through 12.

It would be evident that the hard-decision bit and the confidence bit from the soft-decision circuit 200A traverse through different physical lengths as a result of the physical implementations of the soft and hard decision circuits 200A and 200B respectively. As a result there will be a delay difference between the hard-decision and the confidence bit within the soft-hard circuit 200. In order to ensure during the decoding process that the confidence bit corresponds to the correct hard-decision bit, it is important that the propagation delay is equal in both branches. Accordingly a delay line is provided within the hard decision circuit 200B. Within the experimental results presented within this specification a measured delay difference of 211 ps was compensated using a custom designed microstrip delay line. The measured delay responses and bandwidth of the circuit are described below in respect of FIGS. 11A and 11B.

The experimental performance evaluation of the low complexity soft-decision circuit described above in respect of FIG. 4 was evaluated using an LDPC that had an input data length of 29,759 bits with 7% overhead for an output block length of 32,000; see MacKay "Encyclopedia of Sparse Graph Codes" (http://www.inference.phy.cam.ac.uk/mackay/codes/data.html). This code was chosen for several for several reasons including:

longer block-length LDPC codes perform very close to the Shannon limit under iterative decoding algorithms, see for example MacKay et al "Gallager codes for high rate applications" (http://www.inference.phy.cam.ac.uk/mackay/) and Ho et al "Soft-Decoding of Low-Density Parity Check Codes for DPSK Signals" (Proc. OFC and NFOEC, pp. 1-3, Paper OWE7, 2007);

the code has very low error floor due to the absence of 4-cycles in its graph, see Gallager; and the code length is similar to the LDPC codes proposed in the ITU recommendation while the 7% is the same as currently used Reed-Solomon RS(255, 239) codes; see ITU-T Recommendation G.975.1.

The LDPC code is decoded by a sum-product algorithm (SPA) with 32,000 degree-4 variable nodes and 2241 check nodes with 57/58 degrees, see MacKay and Radford et al "Software for Low Density Parity Check Codes," (http://www.cs.utoronto.ca/~radford/ftp/LDPC-2006-02-08/index.html). The number of iterations was set to 50. The code also has potential for implementation within an FPGA based on reduced complexity algorithms, see Djordjevic et al "On the Reduced-Complexity of LDPC Decoders for Ultra-High-Speed Optical Transmission" (Opt. Express, Vol. 18, No. 22, pp. 23371-23377, Djordjevic3). However, as the intention is to study the performance of a low complexity receiver circuit according to an embodiment of the invention rather than the code performance per se using the SPA satisfies the requirements but the combination of low complexity optical receiver with reduced complexity algorithmic decoding in FPGA is very promising for reduced cost and increased performance LDPC encoding in optical transmission systems. The initial log likelihood ratios (LLR) are calculated accurately using the actual signal amplitude of the received signal, see Djordjevic3. The conditional probability of the observed bit for the received sample is given by Equation (2) below, see Djordjevic3.

$$P(x_j | y_j) = \frac{P(y_j | x_j)P(x_j)}{p(y_j | x_j = 0)P(x_j = 0) + P(y_j | x_j = 1)P(x_j = 1)} \quad (2)$$

where $P(x_j)$ are the known a priori probabilities and $P(y_j|x_j)$ are the transition probabilities calculated from the received signal after the photodetector, see Djordjevic3. The initial LLR is calculated by $$LLR(x_j) = \log\left(\frac{P(x_j = 0 | r_j)}{P(x_j = 1 | r_j)}\right) \quad (3)$$

The initial LLRs calculated by Equation (3) are used for decoding the received signal using iterative soft-decision decoding algorithm, see MacKay and Radford. The n-bit soft-decision is implemented by quantizing the pre-calculated LLR according to a lookup table for each Q value. The hard-decision decoding is performed by an iterative message passing algorithm, commonly known as Gallager-B algorithm, see Gallager.

Figure 4:
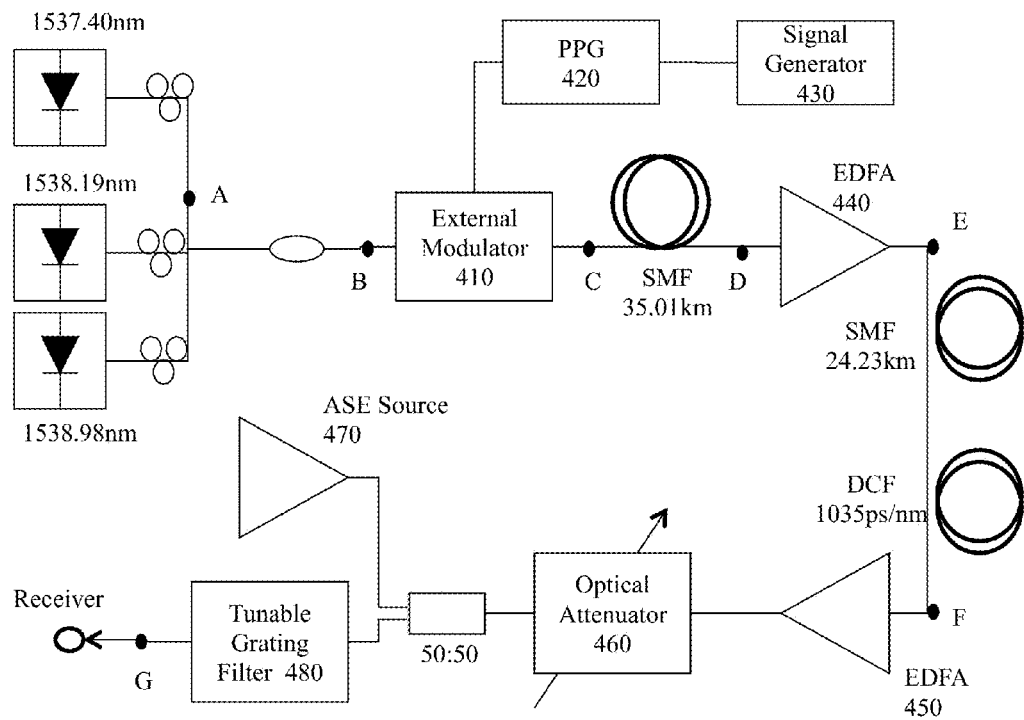
FIG. 4 depicts an optical test bed for performance evaluation of a soft-decision circuit according to an embodiment of the invention.
Figure 5A:
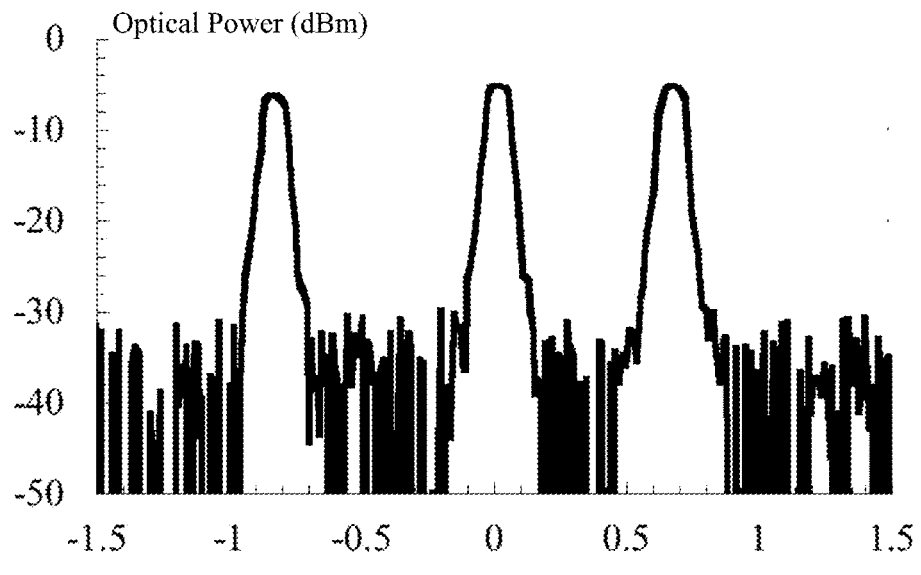
FIGS. 5A and 5B depict depicts the received optical spectrum at different points within the optical test bed of FIG. 4.

The experimental configuration for the performance evaluation of LDPC(32000,29759) with hard-soft decision receiver and optical fiber transmission is depicted in FIG. 4. A tunable multichannel WDM distributed feedback (DFB) laser source emits continuous wave (CW) light at three wavelengths of 1537.40 nm, 1538.19 nm, 1538.98 nm and with an output power of approximately +11.5 dBm/channel (point A in FIG. 4). These channels are separated by 0.79 nm to match the 100 GHz ITU Grid and polarization controllers (PC) are inserted for each of the channels to make sure that all the channels are tuned for equal peak power and maximum extinction at the output of the electro-optic external modulator 410. The channels are multiplexed onto a single fiber using a 4:1 coupler with 6.3 dB of insertion loss such that the total optical power at the output of the multiplexer was approximately +10 dBm or +5 dBm per channel (point B in FIG. 4). The output of the CW light is then injected into the single-drive x-cut lithium niobate electro-optic external modulator 410, driven by the baseband signal from the output of a programmable pulse pattern generator 420 (PPG) controlled by a signal generator 430. FIG. 5A depicts the optical spectrum at the output of the electro-optic external modulator 410 (point C in FIG. 4).

The electro-optic external modulator 410 has an insertion loss of 7 dB and DC extinction ratio of approximately 20 dB. A non return to zero (NRZ) on-off keyed (OOK) signal was generated by biasing the electro-optic external modulator 410 at half power of the transmission curve and driving it with the PPG 420. The DC bias of the electro-optic external modulator 410 was tuned at 3.95V to achieve maximum eye opening at point C before the fiber transmission. The average total optical power after modulation before being launched into the fiber was approximately +0.5 dBm or approximately −5.2 dBm per channel (point C in FIG. 4).

For NRZ-OOK signal over fiber transmission, the actual binary bits of the LDPC code are first loaded into the PPG 420. An additional 225 zeros are inserted at the end of each LDPC frame. These bits are used for frame synchronization and identification of the starting of the frames in the decoder simulator employed by the inventors. The peak to peak voltage of the PPG 420 was set to approximately 250 mV. The baseband signal from the PPG 420 was coupled to the electro-optic external modulator 410 via an optical modulator driver, not shown for clarity, which amplifies input electrical signals to the driving voltage levels of the electro-optic external modulator 410.

The modulated NRZ-OOK optical channels were first sent through 35.01 km of single mode fiber (SMF) with chromatic dispersion of 17 ps/(nm·km) at 1550 nm. After the fiber transmission, the signal is optically amplified by a first erbium doped fiber amplifier (EDFA) 440 from INO (FAW CL) with noise figure (NF) of 5 dB. This first EDFA 440 roughly compensates all the fiber and connector losses for the 35.01 km SMF and the output power at point E in FIG. 4 is approximately −0.3 dBm in both cases, wherein the first EDFA 440 gain is approximately 7.5 dB.

Figure 5B:
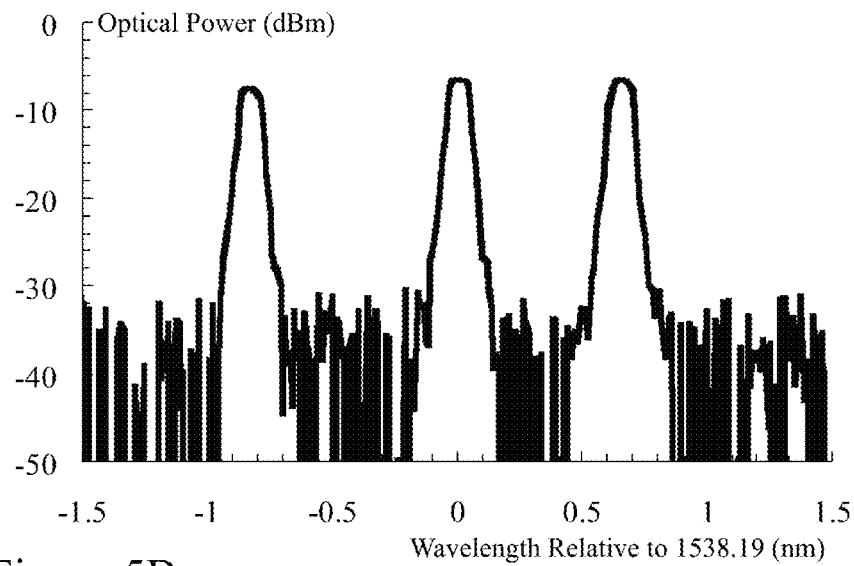
Figure 6:
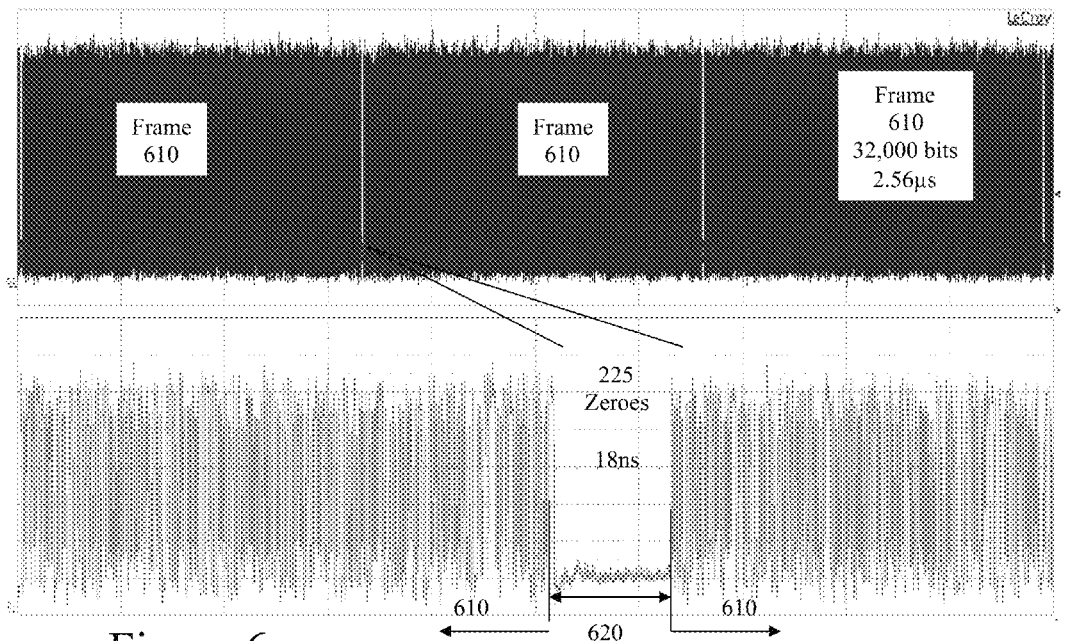
FIG. 6 depicts captured frames and frame intersection in the time domain from a receiver according to an embodiment of the invention.

The optical signal after the first EDFA 440 was then transmitted through 24.23 km of SMF and a spool of dispersion compensating fiber (DCF). The DCF had a total loss of approximately 1.2 dB and return loss of 52 dB at 1550 nm whilst providing a chromatic dispersion of approximately −1035 ps/nm and was designed to perform dispersion compensation for the approximately 60 km of SMF-28 preceding it. The actual total length of SMF actually being approximately 59.24 km. After the DCF (point F in FIG. 4), the optical signal was amplified by a second EDFA 450 to compensate for the losses incurred in the fiber and DCF. Subsequently a variable optical attenuator 460 was used to control the amount of optical power launched into a 50/50 optical coupler. The other input of the 50/50 coupler being connected to an ASE source 470 to degrade the optical signal to noise ratio (OSNR) and the eye opening of the received signal, i.e. degrade pre-FEC Q factor. The resulting optical signal was then coupled via a tunable grating filter 480 with bandwidth of approximately 0.4 nm and insertion loss of approximately 6 dB in order to filter out the middle optical channel (centered at 1538.19 nm) and remove out of band amplified spontaneous emission (ASE) noise. The output of the tunable grating filter 480 is then coupled to the soft-decision circuit, such as described supra in respect of FIG. 2. The resulting optical spectrum after the tunable grating filter 480 (point G in FIG. 4) is depicted in FIG. 5B.

The eye diagram after photodetection and the pre-FEC Q was evaluated using a high speed time sampling oscilloscope (Agilent DCA 86100C with 80 GHz RF bandwidth). The captured frames 610 and frame intersections after separating the hard and soft-decision bits are presented in FIG. 6. There is time gap 620 of approximately 18 ns (225 bits at 12.5 Gb/s) between each frame. The sampling oscilloscope was programmed to capture 4 samples per bit of the received signal to construct the signal successfully. The sampling oscilloscope was controlled through a GPIB interface and a minimum of 3,300 frames, each frame containing 32,000 bits, were captured for each measurement. In total, the number of captured bits is close to the order of $10^8$ bits. Capturing more frames would simply require additional memory capacity, processing and longer record times.

After capturing the frames, these were first processed in MATLAB using the following process:
  remove the 225 zeros initially inserted at the end of each LDPC frame, where these bits were used for frame synchronization and identification of the start of the frame;
  remove the DC offset added by the oscilloscope to the signal (approximately 40 mV); and
  downsample the signal to 1 sample per bit.

The optimum sampling on the bits was found by performing hard-decision error counting on the received bits for different sample position. Finally the samples of the signal were decoded by the soft-decision algorithm for LDPC decoding.

For error correction coding analysis, Q-factor is used as a figure of merit. The Q-factor is defined by Equation (4) where $\overline{I}_j$ and $\sigma_j$ are the mean and standard deviation of the received mark-bit (j=1) and space-bit (j=0). An advantage of using the Q-factor is that it can be measured directly with an oscilloscope and is easier to correlate with simulation results in the narrow waterfall region of the LDPC codes. A plot of Pre-FEC BER versus Q-factor is provided in FIG. 12 as discussed below with experimental data points showing good agreement. It is assumed throughout this analysis that the optical amplifier noise is the most significant source of noise and will be the factor degrading the Q-factor. The photodetector noise can be neglected as long the received signal at the photodetector is above the sensitivity level of the photodetector which is approximately −12 dBm for the components employed in the experimental configuration depicted in FIG. 4. Low noise RF amplifiers were used for amplification after the photodetector and are assume not to degrade the Q-factor.

$$Q = 20 \log [(\overline{I}_1 - \overline{I}_0)/(\sigma_1 - \sigma_0)] \quad (4)$$

For any soft-decision circuit the best possible error correction performance is obtained only in the case where the decision thresholds are placed appropriately and precisely, see for example Agrawal "Lightwave Technology: Telecommunication Systems," (Wiley 2005, Ch. 6, p. 202) and Shimuzu et al "Optimum soft-decision FEC thresholds for on-off optical receiver using block turbo code" (Proc. OFC and NFOEC, pp. 1-3, Paper WM2, 2004). In practical systems, such thresholds are typically set by adaptive decision threshold tracking circuits which continuously tune the levels for optimum decoding performance.

In NRZ OOK systems where the optical amplifier is the primary source of noise the probability distribution or the amplitude histogram is given by a non-central Chi-Squared distribution, see for example Bosco et al "Soft decoding in optical systems" (IEEE Trans. Comm., Vol. 51, No. 8, pp. 1258-1265) and "Soft decoding in optical systems: Turbo product codes vs. LDPC codes" (Opt. Comm. Th. and Tech., Springer ISBN 0-387-23136, pp. 79-86). Though the Q-factor intrinsically assumes a Gaussian distribution, it gives an accurate estimation of the system performance for non-Gaussian distribution when measured at the optimum decision threshold, see Agrawal. The Q-factor measurement is done with optimized threshold level for maximum eye opening on both the captured signal by the sampling oscilloscope and in simulation. Hence, the measurement methodology is equivalent to finding the minimum BER of a non-central Chi-Squared distribution correlating simulation and experimental results. To generalize the results, we normalize the signal amplitude to the mean of the mark or the logic '1', see Bosco.

Figure 7:
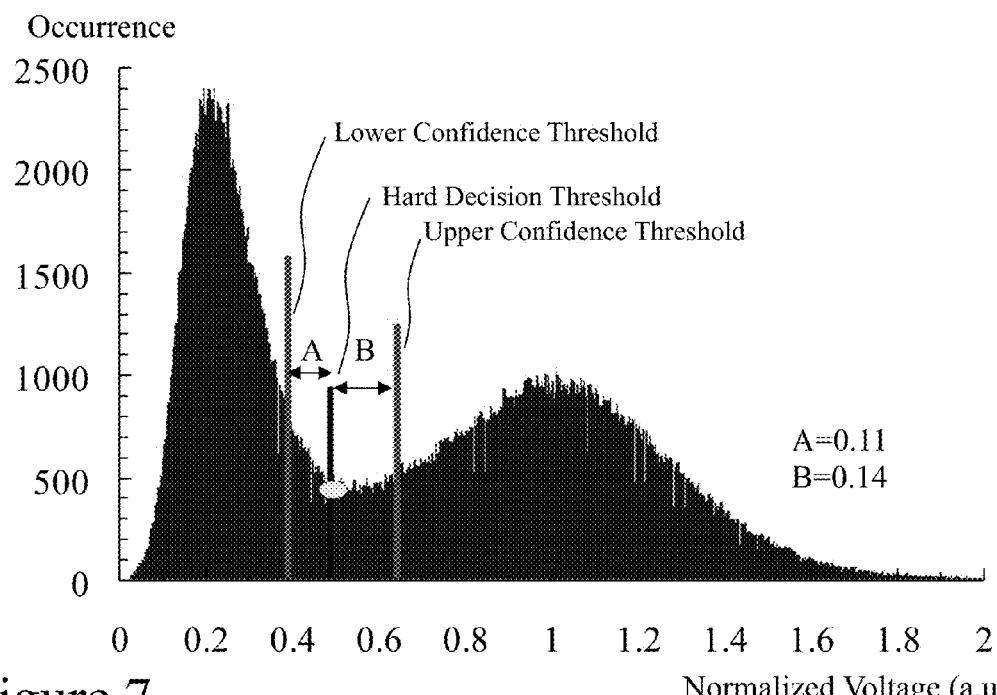
FIG. 7 depicts an experimental amplitude histogram of the captured signal for (1-frame) input to the soft-decision circuit and threshold positions for Q=8.6 dB.
Figure 8:
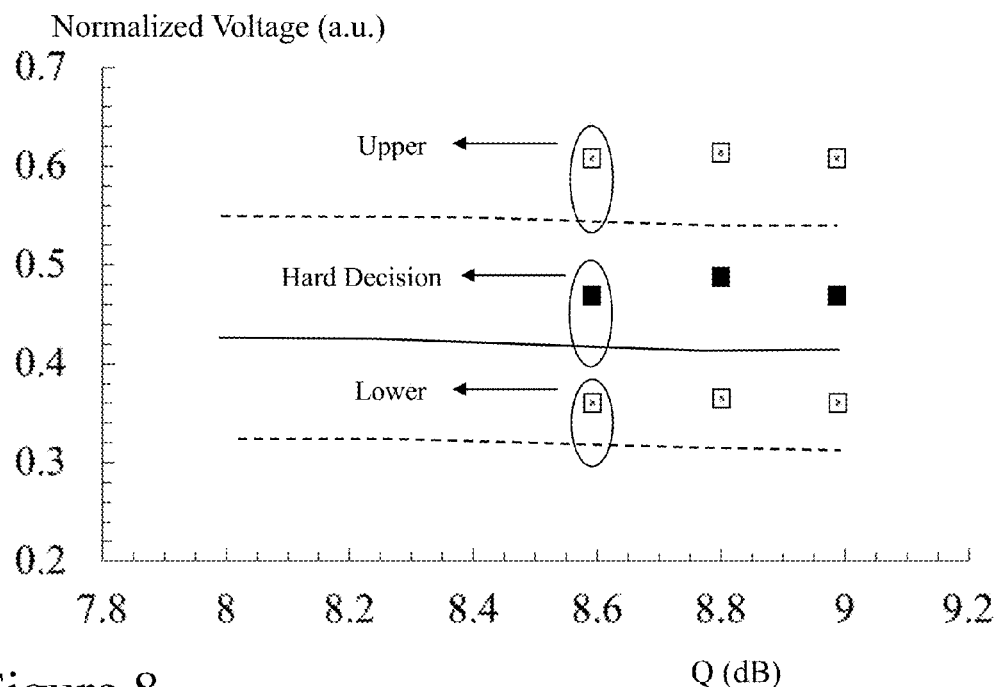
FIG. 8 depicts optimized decision thresholds as a function of Q in the waterfall region of the curve for a soft-decision circuit according to an embodiment of the invention.

Referring to FIG. 7 there is depicted the normalized amplitude histogram of the captured signal for a Q factor of 8.6 dB (BER=$3.6 \times 10^{-3}$) from the experimental results obtained using the experimental configuration in FIG. 4. The signal shows an asymmetric distribution for mark (logic '1') and space (logic '0'). The hard-decision threshold is the cross point between the two asymmetric distributions. The optimum normalized voltage as a function of the Q factor in the waterfall region of the code is presented in FIG. 8. The normalized threshold voltage is tuned for minimum hard-decision BER at each Q point for both the simulation and the experiments. This can be achieved in experiments by observing the eye diagram on the oscilloscope and selecting the threshold at the eye crossing. Simulated results in FIG. 8 show that the optimum normalized hard-decision threshold for a Q of 8.6 dB is approximately 0.42 which is in good agreement with Agrawal. The experimental optimum threshold for hard-decision is around approximately 0.47. The experimental results are in good agreement with the simulated results wherein the experimental results are slightly higher in value due to the amplitude distribution broadening arising from residual chromatic dispersion in the fiber link.

Due to the Chi-Squared nature of the optical channel, a wider spacing for mark and a narrower spacing for space were chosen for the proposed thresholds, see Shimuzu. A similar approach was employed for the hard-decision and tuning the threshold until the minimum soft-decision post-FEC BER was obtained. The simulated results show that at the Q value of 8.6 dB the simulated upper and lower confidence levels are at 0.32 and 0.54, respectively. The experimental values are 0.36 and 0.61. These results show that for optimum confidence levels the ratio of the threshold spacing between mark-confidence/hard-decision-bit and space-confidence/hard-decision-bit is approximately 1.3. The measured difference between two confidence levels is approximately 45 mV for an input peak to peak voltage level of 320 mV. It was found by the inventors that following these ratios provided optimum BER for a wide range of Q values in the waterfall region of the code.

Figure 9:
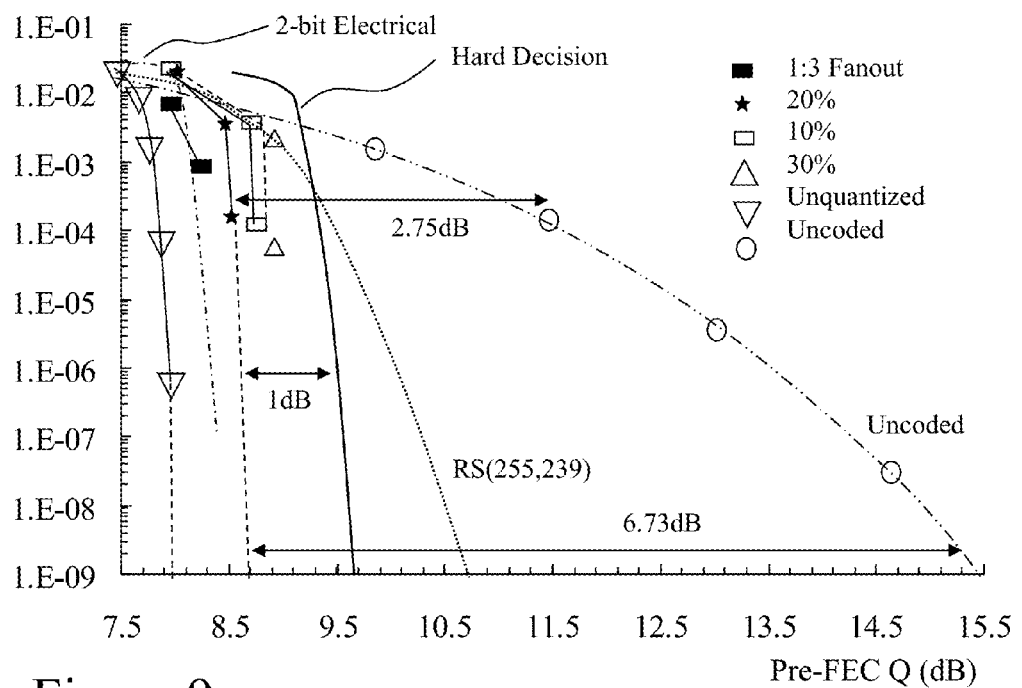
FIG. 9 depicts decoding performance of a soft-decision circuit according to an embodiment of the invention.

Now referring to FIG. 9 there are depicted the simulated and experimental results for the decoder wherein the post-FEC bit error rate (BER) was studied as a function of Q-factor. To investigate the performance of the hard-soft receiver circuit according to embodiments of the invention the performance is compared to the electrical fan-out case where a 1:3 electrical fan-out is used. The results in FIG. 9 show that if approximately 20% of the optical power is coupled for soft-decision circuit, there is a degradation of approximately 0.35 dB in the Q factor with respect to the electrical fan-out case (2-bit all electrical soft-decision). When compared to the ideal unquantized case this penalty is approximately 0.85 dB. The coding gains achieved by extrapolation in FIG. 9, are approximately 2.75 dB, 6.73 dB and 9.4 dB for post-FEC BER of $10^{-4}$, $10^{-9}$, and $10^{-15}$ respectively. In addition, the coding gains over hard-decision are approximately 1.0 dB and 1.4 dB for post-FEC BER of $10^{-4}$ and $10^{-15}$ (extrapolated) respectively. It may be noted that due to the structure of its parity check matrix, LDPC codes may exhibit an "error floor" phenomena in the experimental post-decoder BER leading to no further improvement in post-FEC BER after a certain Q-factor, see for example Chang et al "Forward error correction for 100 G transport networks" (IEEE Comm. Mag., Vol. 48, No. 3, pp. S48-S55). The hardware implementation of the LDPC code used in this work does not exhibit an error floor for BER as low as $10^{-16}$, see Tychopoulos. However, the potential existence of an error floor at lower BER is typically not an issue for the system applications discussed.

Figure 10:
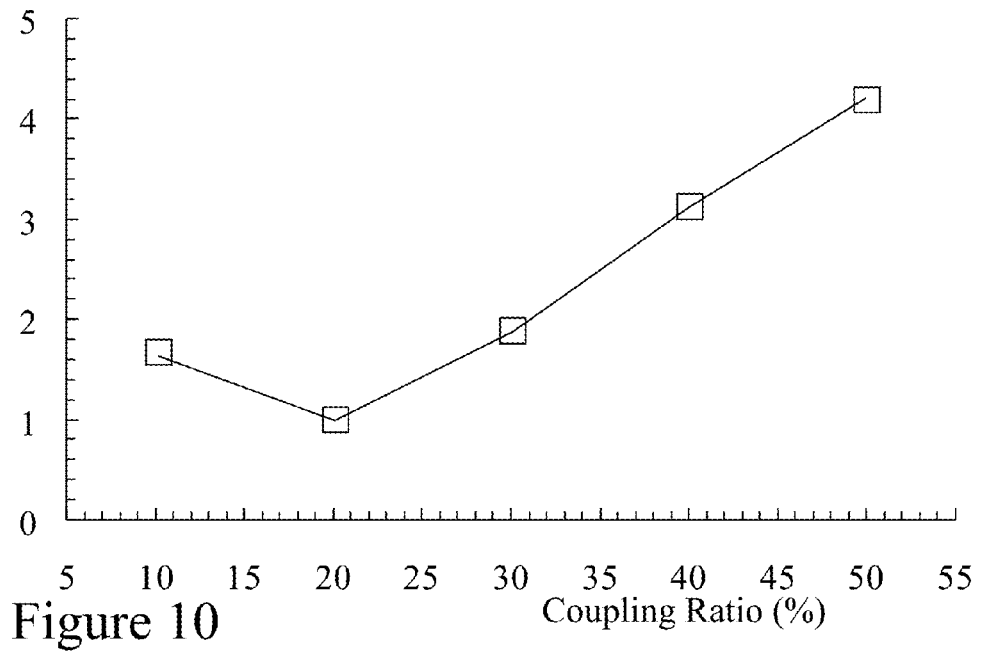
FIG. 10 depicts the optical power penalty as a function of coupling ratio for a receiver according to an embodiment of the invention.
Figure 11A:
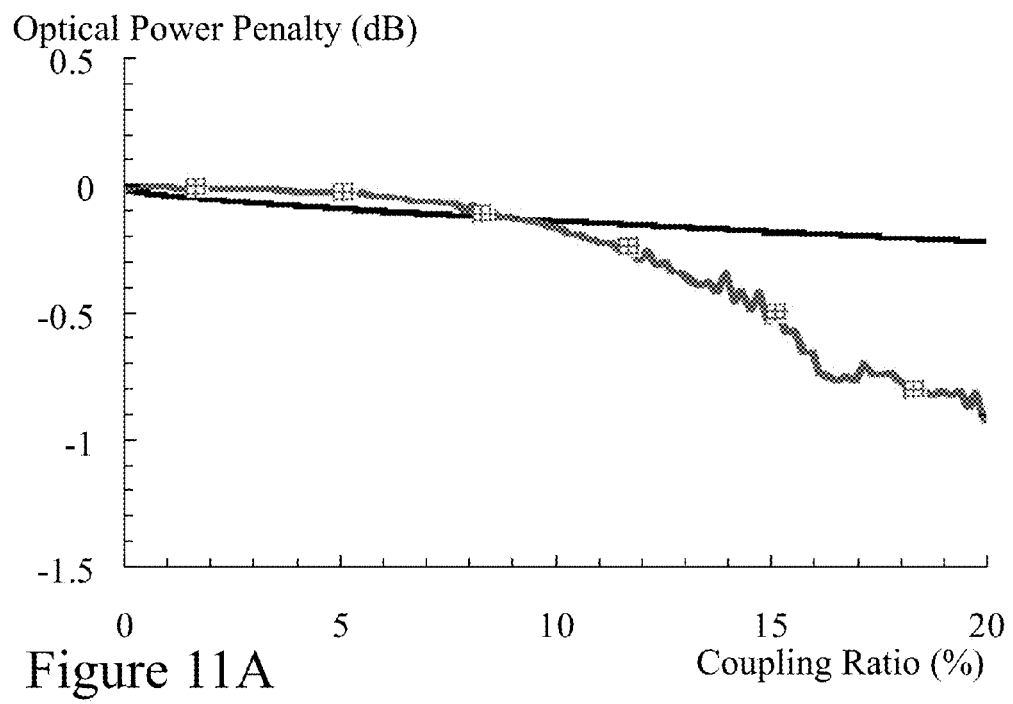
FIGS. 11A and 11B depict the magnitude and delay response of the delay line employed within an experimental soft-decision circuit according to an embodiment of the invention.
Figure 11B:
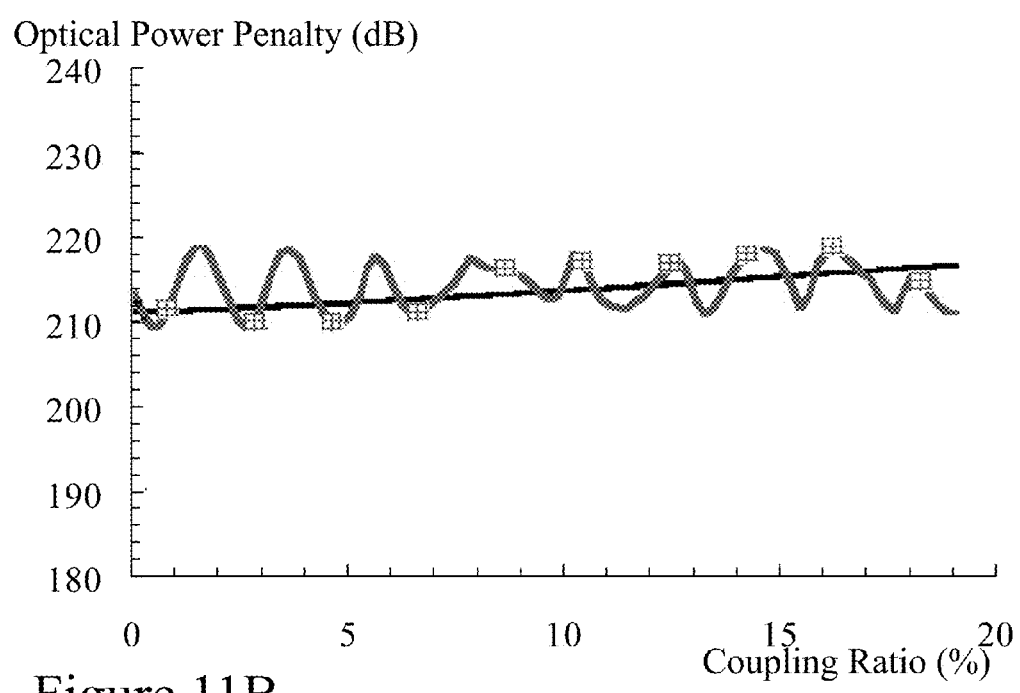
Figure 12:
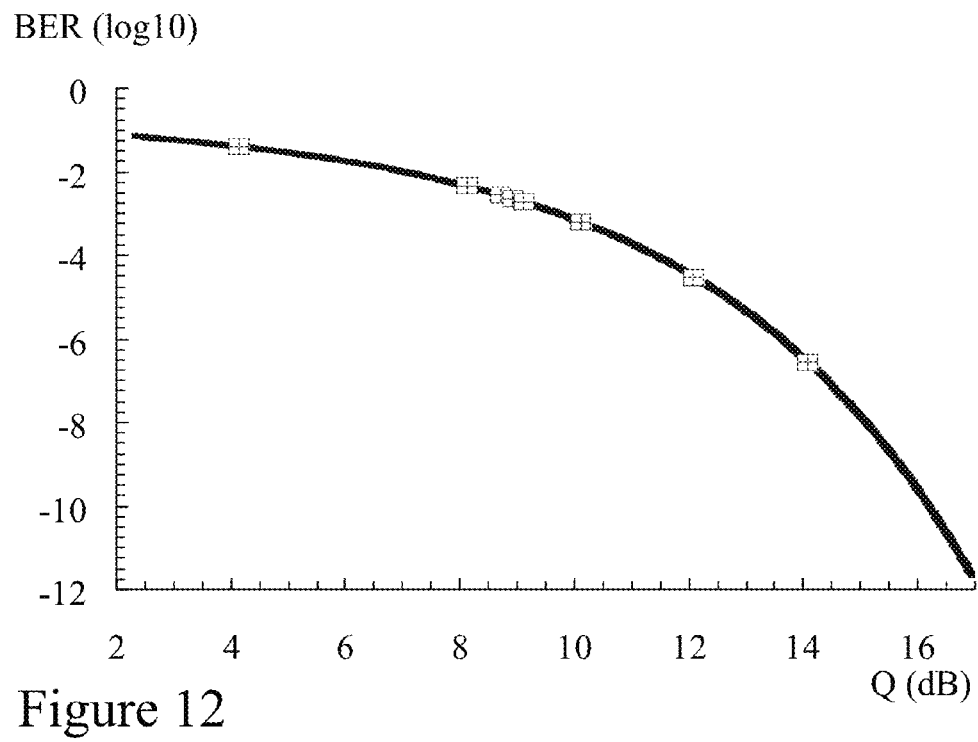
FIG. 12 depicts pre-FEC BER results as a function of pre-FEC Q for a soft-decision circuit according to an embodiment of the invention.

Now referring to FIG. 10 the optical power penalty for different coupling ratios between hard and soft decision circuits is depicted for error free transmission (BER≤$10^{-8}$). The minimum received optical power for error-free transmission was first measured when the photodetected signal was electrically fanned out to the soft and hard-decision segments. Accordingly, it can be see that for the 20% coupling ratio identified above in respect of FIG. 9 results in an optical power penalty of approximately 0.9 dB. In FIG. 9 the Q-factor degradation increases to approximately 0.54 dB if 10% of the optical power is used. Hence as expected for 10% coupling ratio the optical power penalty is also higher, approximately 1.6 dB. The performance degrades due to low signal-to-noise ratio (SNR) for the soft-decision bit and peak power below the sensitivity of the photodetector. For 30% coupling ratio and above the performance degrades due to lower performance of the hard-decision receiver. For a coupling ratio of 40% and 50% the optical power penalty reaches approximately 3.1 dB and 4.2 dB, respectively.

Accordingly within the experimental embodiments and analysis for the hard-soft receiver architecture according to embodiments of the invention a coupling ratio of 20% is beneficial. Although the performance in the optical coupling case is slightly degraded than the all-electrical fan-out case for the same received optical power, its simplicity makes it a beneficial solution. Also as discussed below the overall power dissipation is low.

The power dissipation by a soft-decision circuit according to embodiments of the invention is broken down in Table 2 for soft-decision circuits operating at 13 GS/s and 50 GS/s. The overall power consumption is approximately 5 W for the soft-decision and approximately 3.8 W for the hard-decision circuitry. It should be noted that more than 70% of the power is consumed by the RF amplifiers such that this power consumption could be reduced by using more power efficient RF amplifiers such as the HMC460 from Hittite Microwave Corporation which consumes 2 W instead of the ZVA213 amplifiers that consume 3.6 W used within the experiments reported herein. In that instance, the total power consumed by the hard and the soft-decision circuit would be approximately 5.4 W.

TABLE 2

Power Consumed by the Components in the Soft-decision Circuit

| | 13 GS/s Implementation | | 50 GS/S Implementation | |
|---|---|---|---|---|
| Component | Power Consumed (W) | Component Part Identifier | Power Consumed (W) | Component Part Identifier |
| Buffer | 0.290 | HMC744 | 0.465 | HMC842 |
| Comparator | 0.165 | ADCM572 | 0.300 | HMC865 |
| XNOR | 0.240 | HMC745 | 0.510 | HMC844 |
| MUX | 0.510 | HMC854 | 9.000 | MX4112 |
| RF Amplifier | 3.600 | ZVA213 | 1.750 | HMC930 |

Beneficially the soft-decision circuit according to embodiments of the invention is scalable to 50 GS/s by simply replacing the 13 GS/s components with higher bandwidth ones. The power consumed by current commercial off the shelf components at 50 GS/s is also shown in Table 2. The overall power consumption at 50 GS/s is approximately 14.3 W wherein approximately 63% of the power consumption comes from the MUX identified as currently commercially available. Accordingly it would be evident that absent this MUX the differential power consumption between 13 GS/S and 50 GS/s is minimal.

It would be evident to one skilled in the art that the soft-decision circuit methodology presented supra with respect to embodiments of the invention may be applied in other communications architectures based upon different transmission schemes. For example the extra coding gain provided by the soft-decision circuit over hard-decision could be used with optical differential quadrature phase shift keying (DQPSK) modulation for a 100 Gb/s implementation without using a coherent receiver. In addition, the soft-decision circuit can be used as a 50 Gb/s 2-bit analog to digital converter (ADC) with a dual polarization (DP) QPSK based coherent optical receiver yielding in aggregate bit rate of 200 Gb/s.

Accordingly a low complexity implementation of a soft-decision circuit has been outlined and discussed above in respect of embodiments of the invention for the decoding of low density parity check (LDPC) codes in conventional direct detection optical systems as well as for other communication architectures and link schemes. Accordingly a predetermined amount of the optical power prior to the optical receiver is used for determining the confidence levels of the soft-decision receiver. The scheme according to embodiments of the invention beneficially requires no modification of the current optical infrastructure while benefiting from soft-decision decoding approach.

As discussed supra in respect of FIG. 2 there will be a delay difference between the hard-decision and the confidence bit within the soft-hard circuit 200. Accordingly within the experimental embodiments of the invention the inventors implemented a delay line 260 which based upon experimental measurements required a delay of 211 ps. The delay line 260 was designed using ANSOFT HFSS software for Rogers RT Duroid 5880 high frequency laminate. The design required an electrical length of 360° and Frequency=1/Delay. The laminate has a dielectric constant of 2.2 and thickness of 0.508 mm such that the simulated microstrip length for 211 ps delay was approximately 4.6 cm. The simulated and experimental amplitude and delay responses for the delay line are presented in FIGS. 11A and 11B respectively. The magnitude response tends to decay after 10 GHz due to the bandwidth limited SMA connectors used for connection. However, the response satisfies the requirements for the experimental measurements quite well although it would be evident to one skill in the art that improved and alternative delay line designs and components may be employed.

The relationship between the BER and the Q-factors is given by Agrawal "Fiber-Optic Communication Systems" (Wiley, 4th ed., ISBN 0471215716, Ch. 4) as reproduced below in Equation (4).

$$BER = \frac{1}{2}\text{erfc}\left(\frac{Q}{\sqrt{2}}\right) \quad (4)$$

where erfc is the complementary error function. A plot of calculated BER from Equation (4) is presented in FIG. 12 along with the experimental results. The experimental uncoded BER for different values of Q-factor at the optimum decision threshold are in good agreement with the calculated BER.

Figure 13:
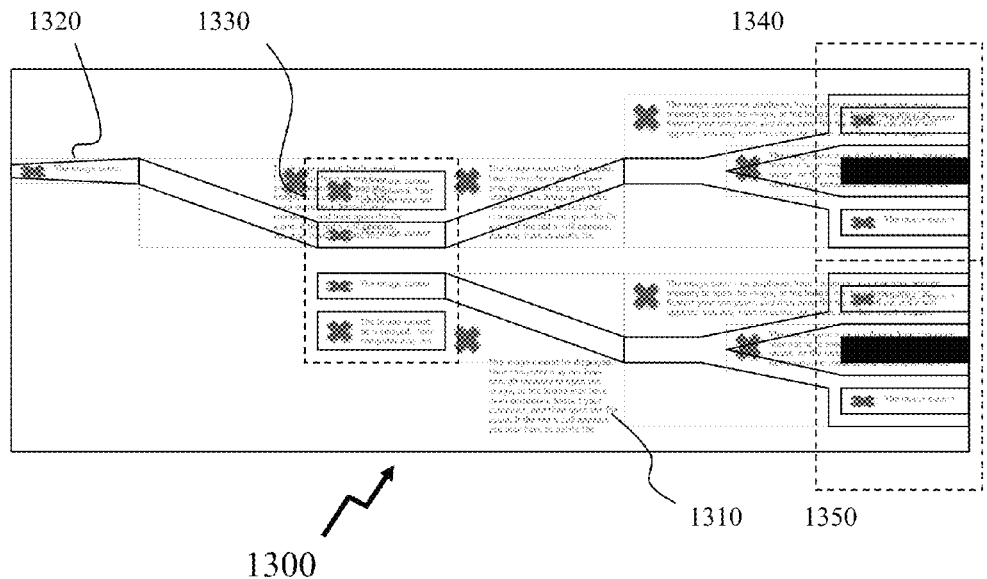
FIG. 13 depicts a hybrid integrated opto-electronic receiver according to an embodiment of the invention.

Within the descriptions supra in respect of FIGS. 1 through 12 the invention has been described with respect to an optical splitter, soft decision circuit and hard decision circuit wherein an initially deployed hard decision circuit can be retrofitted with the optical splitter and soft decision circuit to provide the combined soft-hard circuit according to embodiments of the invention. However, it would be evident that in initial deployments that all elements may be provided together. In such scenarios an opto-electronic integrated circuit (OEIC) may be employed to provide the optical receiver front end and passive splitter. Such an OEIC 1300 being depicted in FIG. 13 comprising a substrate 1310 upon which are integrated a mode transformer 1320 allowing the optical signal from the singlemode optical fiber to be efficiently coupled to the OEIC 1300, a directional coupler 1330 based power splitter, and first and second waveguide photodetectors 1340 and 1350 respectively. The electrical outputs of the first and second waveguide photodetectors 1340 and 1350 may be coupled to a subsequent electronic circuit or circuits providing the initial RF amplification for each of the hard and soft decision paths as well one or more of the other electrical elements described above in respect of FIG. 2.

Optionally the initial electrically converted signals may be pre-amplified using TIA elements integrated with the OEIC 1300 as may the received optical signal prior to conversion through provisioning of semiconductor optical amplifiers (SOAs) within the OEIC 1300. Optionally the directional coupler 1330 may be replaced with other optical splitters such as for example asymmetric Y- or X-junctions or Mach-Zehnder structures or a simple Y-junction wherein optical power to the soft and hard decision paths is managed through biasing integrated SOAs, waveguide photodetectors, or gain of the RF amplifiers. It would also be evident that the subsequent hard and soft decision paths may be implemented as one or more ICs and that these may be hybridly or monolithically integrated with the OEIC 1300. The resulting output from the soft-hard decision circuit may then be coupled directly for example into an FPGA decoding the received bit stream such as described above.

45 Gb/s Optical Soft-Decision Front End Implementation and Experimental Results

Figure 14B:
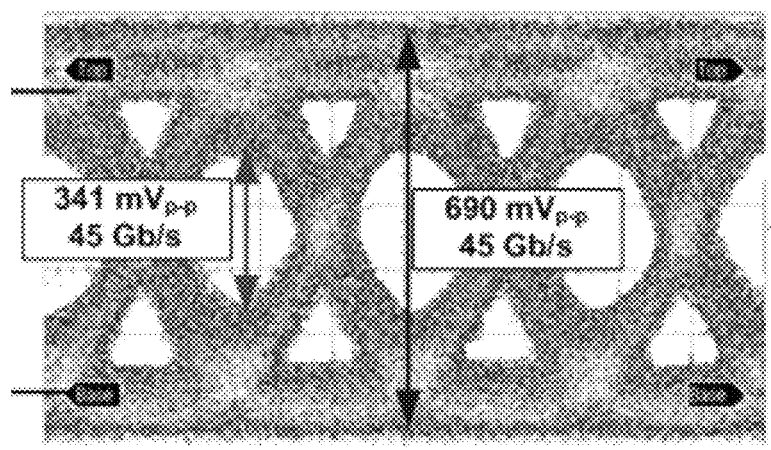
FIG. 14B depicts an eye-diagram for a receiver according to an embodiment of the invention at 45 Gb/s using the decision circuit depicted in FIG. 14A.
Figure 14A:
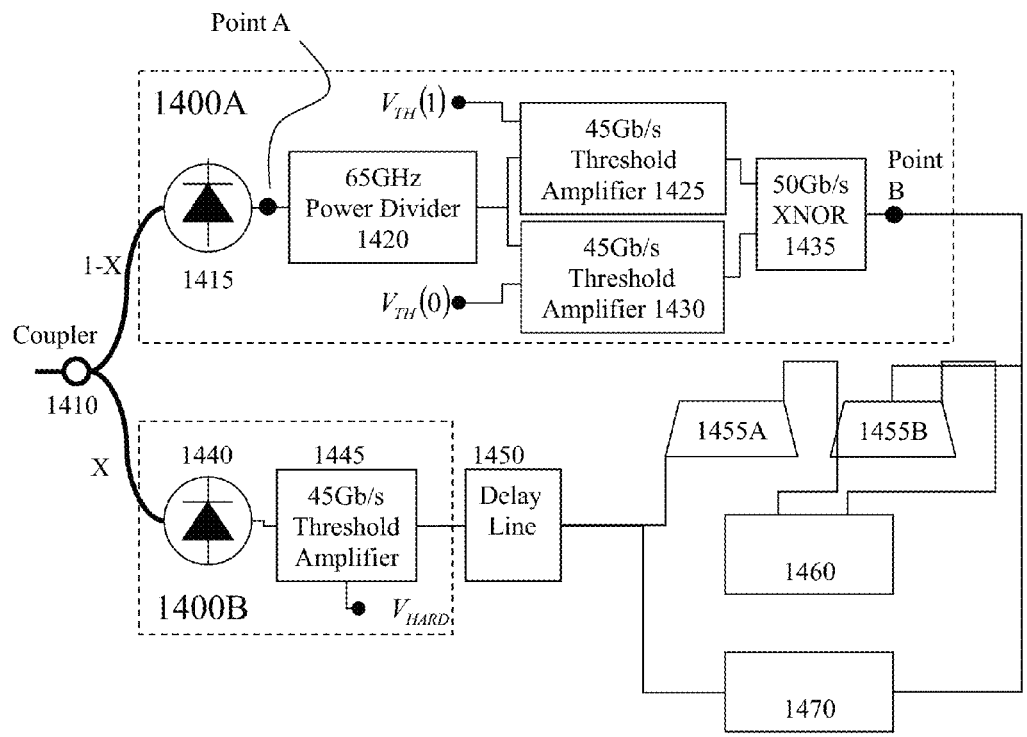
FIG. 14A depicts a low complexity soft-decision circuit according to an embodiment of the invention operating at increased rate to the circuit depicted in FIG. 2.

Subsequently a soft-decision circuit was implemented for operating at 45 Gb/s as depicted in FIG. 14A. As discussed supra in respect of FIG. 2 the signal from the optical system is initially optically split by coupler 1410 between the soft-decision circuit 1400A and hard-decision circuit 1400B and coupled to the first and second photodetectors 1415 and 1440 within these circuits respectively. According, as with FIG. 2, discrete components were employed for of which the main building blocks within the soft-decision circuit 1400A were:

electrical power splitter 1420, such as Anritsu 240C;

first and second high speed limiting amplifiers 1425 and 1430 respectively, such as Hittite Microwave Corporation HMC866 with tunable threshold; and XNOR gate 1435, such as Hittite Microwave Corporation 50 Gb/s XNOR HMC-C064.

The main building block within hard-decision circuit 1400B was a third high speed limiting amplifier 1445. First and second photodetectors 1415 and 1440 were from Discovery Semiconductors (DSC-10H) with RF bandwidth of 46 GHz and responsivity of 0.8 A/W. Within soft-decision circuit 1400A the In the soft-decision segment 1400A the threshold values $V_{TH1}$ and $V_{TH0}$ were tuned with precision power supplies with a tuning resolution in the order of 1 mV. These threshold values $V_{TH1}$ and $V_{TH0}$ were respectively placed at the lower tail of the distribution of "ones" and upper tail of the "zeros" as shown in Table 1. The outputs of the first and second limiting amplifiers 1425 and 1430 respectively are coupled to the XNOR gate 1435 which provides the confidence level by encoding the 2-bit binary vector to a single bit indicating the confidence of the received bit (i.e. high or low). The output eye of the soft-decision circuit 1400A at 45 Gb/s is presented in FIG. 14B as measured at Point B, indicated in FIG. 14A. As evident a good eye opening of 341 $mV_{P-P}$ was measured for a 24 m $V_{P-P}$ (as measured at Point A in FIG. 14A) input signal to the front-end and output level of 690 m $V_{P-P}$ (point B in FIG. 14A). The soft decision circuit has a sensitivity of 10 m $V_{P-P}$ and gain of 29 dB.

The propagation delay difference between the hard-decision and the confidence bit at the processing device is compensated using a tunable electrical delay line 1450, such as SHF Electronics SHF2000DEL. This can also be achieved using delay lines, see Sakib1. Each branch of the soft-decision circuit operates up to 45 Gb/s. A high-speed demultiplexer or an 1:N selector can be used to de-serialize the high speed signals for real time data processing at lower clock rate by an FPGA used for the decoder implementation, see the inventors for example in Naderi et al "Delayed Stochastic Decoding of LDPC Codes" (IEEE Trans. Signal Process., Vol. 59, pp. 5617-5626). Within the experimental singlemode fiber optical link configuration, the hard-decision and confidence bits were captured by a dual channel sampling oscilloscope 1470 for the long block code. The maximum data rate in the inventors multimode optical fiber link configuration was 15 Gb/s and 32 Gb/s 1:2 full rate selectors, such as for example Hittite Microwave Corporation HMC955, were used to sample the signal for the short block length code onto real-time oscilloscope 1460. These 32 Gb/s 1:2 full rate selectors being depicted by first and second demultiplexers (DEMUX) 1455A and 1455B respectively. Changing the clock rate controls the number of samples per bit (up to 2.1 samples/bit at 15 Gb/s).

45 Gb/s Experimental Configurations

For performance analysis of soft-decision circuits according to embodiments of the invention two types of LDPC codes were used. The long block length codes have a high coding gain and usually more suitable for singlemode fiber based long haul optical links because of hardware complexity. Whereas, in contrast short block length codes have moderate coding gain, but are more suitable for multimode fiber based short haul optical data center links where low latency and power consumption are more important requirements.

The high coding gain LDPC(32768,26803) long block length code was adopted from Naderi. This long block is suitable for a high throughput, energy efficient implementation using low complexity stochastic decoders as described by Naderi. Due to the structure of its parity check matrix, LDPC codes may exhibit "error floor" phenomena in the post-decoder BER leading to no further improvement in post-FEC BER after a certain signal-to-noise ratio, see for example Chang. It is observed from simulation that the LDPC(32768,26803) has a very low error floor ($<10^{-12}$). The short block length LDPC selected was originally adopted from the recent IEEE 802.15.3.c standard for ultra wideband (UWB) wireless communication applications, see for example IEEE 802.15 WPAN "Wireless Medium Access Control (MAC) and Physical Layer (PHY) Specifications for High Rate Wireless Personal Area Networks (WPANs) Amendment 2: Millimeter-Wave-based Alternative Physical Layer Extension" (2009) and inventors in Sakib et al in "Low-Density Parity-Check Coding in Ultra Wideband over Fiber Systems" (IEEE Photon Tech. Lett., Vol. 23, pp. 1493-1495, hereinafter Sakib2) for example. Receivers for UWB communications have stringent requirements in terms of cost, a few dollars at most, and decoder latency. As such, these codes are good candidate for short haul and access network link applications. The BER performances of short block length LDPC (672, 336), (672, 504), (672, 588) and (1440, 1344) codes with a 32 GS/s 2-bit flash ADC and a 6-tap FIR filter equalizer was evaluated for a multimode optical link as outlined below. The LDPC code is decoded by a sum-product algorithm (SPA), see for example Kschischang et al in "Factor Graphs and the Sum-Product Algorithm" (IEEE Trans. Inf. Theory, Vol. 47, pp. 498-519) and Radford. The number of iterations was set to 50 and within simulations the log likelihood ratios (LLR) required for FEC decoding was calculated based on the received signal's probability density function, see Djordjevic1. The n-bit soft decision is implemented by quantizing the pre-calculated LLR according to a lookup table.

For error correction coding analysis, Q-factor is used as a figure of merit to correlate the results in the narrow waterfall region. The Q-factor is defined as $Q=20 \log[(\overline{I_1}-\overline{I_0})/(\sigma_1-\sigma_0)]$, where $\overline{I}_j$ and $\sigma_j$ are the mean and standard deviation of the received mark-bit (j=1), and space-bit (j=0), see Agrawal "Lightwave Technology: Telecommunication Systems," (Wiley 2010, Ch. 4, hereinafter Agrawal2). Though the Q-factor intrinsically assumes a Gaussian distribution, it gives an accurate estimation of the system performance for non-Gaussian Chi-Squared distribution when measured at the optimum decision threshold, see Agrawal2. The Q-factor measurement is done with optimized threshold level for maximum eye opening on both the captured signal by the oscilloscope and in simulation. Accordingly, the measurement methodology is equivalent to finding the minimum BER of a non-central Chi-Squared distribution correlating simulation and experimental results.

Experimental 45 Gb/s Single-Mode Transmission Link:

The considered system setup for the performance evaluation of LDPC(32768,26803) at 45 Gb/s with optical fiber transmission is shown in FIG. 15A. Three DFB laser sources emitting at wavelengths of 1533.47 nm, 1534.25 nm, and 1535.04 nm and with an output power of approximately +13 dBm/channel (point A in FIG. 15A) were used. The three optical channels are combined using a 1:4 optical multiplexer within an insertion loss of 6.7 dB yielding an optical power after the multiplexer of approximately +11 dBm (point B in FIG. 15A) or +6.2 dBm per channel. The CW multiplexed optical signals were then coupled into an X-cut zero chirp Mach-Zehnder modulator (MZM) 1515, driven by the baseband signal from the output of the programmable pulse pattern generator (PPG) 1510 coupled to a signal generator (SIGGEN) 1505. The MZM had an insertion loss of 7 dB, an extinction ratio of approximately 17 dB (DC), and $V\pi$ of 5.2V. The average total optical power after modulation before being launched into the fiber was approximately 0.77 dBm per channel (point C in FIG. 15A).

For single-mode long-haul transmission, the long block length LDPC code contains 32768 bits. Each block is preceded by 56 unique preamble bits to identify each frame in the received sequence using cross-correlation, four large frames and their respective preambles form a super frame of about 132,000 bits captured by the oscilloscope. The super frames of the LDPC code were first loaded into the PPG 1510 using a MATLAB interface prior to their use for transmission over the optical channel. Four PPG 1510 cards were actually employed followed by a 4:1 multiplexer, Anritsu MUX not shown for clarity, to generate the desired signal at 45 Gb/s. The PPG 1510 module was clocked at 45 GHz by using an Anritsu continuous wave (CW) SIGGEN 1505. The baseband signal from the multiplexer was sent to a modulator driver, for example SHF SHF810, with a gain of +29 dB amplifying the input signals to the $>5.2V_{P\text{-}P}>+5.2$ drive levels of MZM 1515.

The modulated NRZ-OOK optical channels were first sent through 59.24 km of single mode fiber (SMF), with fiber loss of $\alpha=0.22$ dB/km and chromatic dispersion of 17 ps/(nm·km) at 1550 nm. The modulated signal was then sent through a spool of dispersion compensating fiber (DCF) having a total loss of approximately 1.2 dB and return loss of 52 dB at 1550 nm with chromatic dispersion of −1035 ps/nm to perform dispersion compensation for the 60 km of SMF-28. After the fiber transmission, the signal is optically amplified by an erbium doped fiber amplifier (EDFA) 1520 from INO (FAW CL) with a noise figure (NF) of 5 dB. This EDFA roughly compensates all the losses associated to the SMF-28 fiber, DCF fiber and connectors. The output signal from the amplifier is launched into a 50/50 optical coupler via variable optical attenuator (VOA) 1525. The other input of the 50/50 coupler is connected to an amplified spontaneous emission (ASE) source (PriTel FA22) to degrade the optical signal to noise ratio (OSNR) and the eye opening of the received signal, i.e. degrade pre-FEC Q-factor.

A tunable grating filter (TGF) 1540 with bandwidth of 0.8 nm and an insertion loss of 6 dB is used to filter out the middle optical channel (centered at 1534.25 nm) and remove out of band ASE noise. The output of the filter is then coupled to a soft-decision circuit via a 20/80 optical coupler, Coupler 1410 in FIG. 14A. The coupling ratio of 20/80 being a good compromise between degrading performance due to operating near the receiver sensitivity of the soft decision segment and consuming too much power in the soft decision segment at the expense of the hard decision segment, see Sakib1. The optical power after the TGF 1540 (point D in FIG. 2) is approximately +4 dBm such that the optical power to the first and second photodetectors 1415 and 1440 respectively of the soft and hard-decision segments were −4 dBm and 2.6 dBm, respectively. The effect of residual chromatic dispersion results in a slight increase of the threshold levels, see Sakib1, and the optimum input power may vary depending on the system. The optical soft-decision front suffers from a power penalty for the same received optical power due to the power loss from the hard-decision brunch when compared to all electrical front-end, see Sakib1. However, considering the bandwidth, linearity and simplicity, the optical front-end offers a beneficial approach.

Experimental Test Bed for 32 GS/s Multimode Optical Link:

The system setup for the performance evaluation of error correction codes and equalization with 500 meters of multimode optical fiber transmission is shown in FIG. 15B. The actual binary bits of the different codes are first generated in MATLAB and loaded into the Driver 1550, comprising PPG 1510 and Signal Generator 1505 described supra. The baseband signal from the Driver 1550 was used to directly modulate a VCSEL-based 10 Gb/s SFP+ evaluation board, Finisar, emitting at 850 nm, depicted as VCSEL 1555. The evaluation board is designed to transfer 10 Gb/s over 500 m of multimode OM-3 type fiber with the sensitivity of −9 dBm and has an electronic bandwidth of 7 GHZ. At the receiving end for the photodetector (PD) 1575 a 25 GHz multimode photodetector (Discovery Semiconductor DSC-R409) was employed. The legacy 10 Gb/s transmitter/receiver pair were measured to support a maximum achievable bit rate of 15 Gb/s with a receiver sensitivity of −2 dBm at BER of $10^{-7}$ for a back-to-back connection without any equalization or error correction. The optical power output of the transceiver at point A in FIG. 15B is 0 dBmn. The modulated optical signal is sent through 500 m of OM-3 type multimode fiber (MMF), with a total fiber loss of 1.5 dB at 850 nm. In this setup, a 28-72% multimode coupler (x=28) was employed, Coupler 1565, as a 20-80% multimode coupler was not available. The back-to-back optical power transferred to the soft and hard-decision segments was −6.2 dBm and −2.0 dBm, respectively.

Block Code Measurement Technology

For each measurement, a minimum of 3301 frames (each frame contains ~$1.3 \times 10^5$ bits) are captured. In total, the number of captured bits is close to $4.4 \times 10^8$ bits. For efficient frame capturing and post processing, multiple blocks of coded data are added to form a large frame of about 33,000 bits as mentioned earlier. Similarly, the 56 preamble bits identify each frame in the received sequence using cross-correlation, but are also used as a training sequence for the FIR equalization. The equalization is used to enhance the data rate of the multimode transmission link. The initial tap weights of the equalizer are set using this unique preamble. The tap values were dynamically adjusted using the least-mean squared (LMS) adaptive algorithm throughout the equalization stage, see Haykin and Widrow in "Least-Mean-Square Adaptive Filters" (Wiley, 2003).

After capturing the frames, offline processing was performed using MATLAB as follow. First the frames were synchronized using cross correlation of the received data with predefined unique preamble. Then the DC offset added by the oscilloscope to the signal was removed. For 45 Gb/s long single mode fiber based system, the signal was down sampled to 1 sample per bit since no equalization is required. The optimum sample on the bits was found by performing a hard-decision error counting on the received bits for different time sampling position. For the equalized multimode fiber based system, two samples per bit were passed to the FIR equalizer for equalization. From the samples of the signal, we decode the signals by soft-decision algorithm for LDPC decoding.

Forward error correction codes add a certain percentage of overhead to the original signal. For example, a LDPC(32768, 26803) code has a code rate of 81.8% of the systems bit rate (R=26,803/32,768) such that 0.87 dB (10 log(0.818)=0.87 dB) of the optical power is wasted for transmitting the overhead bits and not the actual data of information, We assume that the maximum bit rate is limited by the optoelectronics such that the bit rate can be the same for an uncoded system. Hence, the spectral efficiency with respect to the bit rate remains the same for either a coded and uncoded system while it is worsen for the case of the spectral efficiency with respect to the code rate taking into account the overhead. For system generality, the power penalty due to the overhead is taken into account instead. The Q value corresponding to the measured BER is adjusted by a correcting factor of −10 log(R), where R is the code rate defined as the ratio of bit rate without FEC to bit rate with FEC, see for example Onohara. The correction factor is useful in expressing the results in terms of NCG which includes the loss due to the code, see for example Onohara.

45 Gb/s Experimental Results

Using the experimental setup as shown in FIG. 15A the inventors first experimentally characterized the impact of optical modulation and fiber transmission using measured Post-FEC BER. The BER performance of the long block LDPC code is analyzed with the 45 Gb/s optical front-end. In the second part the performance of the short block length codes with an FIR equalizer is evaluated using setup in FIG. 15B configured as a 32 GS/s ADC. Finally the power consumed by the soft-decision front-end under different scenarios is presented.

Figure 16:
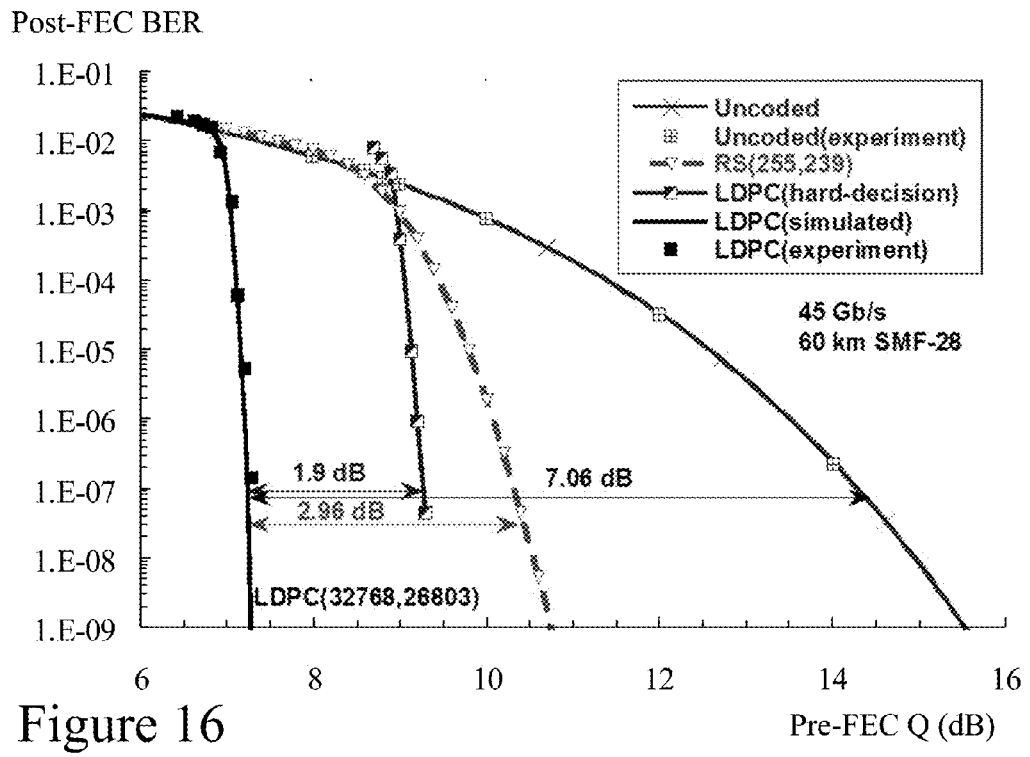
FIG. 16 depicts decoding performance of the soft-decision circuit according to an embodiment of the invention as depicted in FIG. 14A.

45 Gb/s Soft-Decision Front End Performance:

The experimental and simulated results for 45 Gb/s NRZ-OOK signal are depicted in FIG. 16. The pre-FEC Q-factor in the horizontal axis represents the signal quality calculated from the hard decision segment of the optical front-end before soft-decision error correction. The post-FEC BER indicates the bit error ratio after error correction using the confidence information from the soft decision branch. The solid line shows the simulated results for LDPC(32768,26803) using 2-bit soft decision. The squares show the measured values from the experiment. The NCGs achieved were 7.06 dB, 8.25 dB and 9.62 dB for post-FEC BER of $10^{-7}$, $10^{-9}$, and $10^{-12}$ (extrapolated), respectively. The NCG was 1.9 dB when compared to hard-decision decoding. In addition, the coding gain over conventional RS(255,239) code is 2.96 dB and 4.0 dB for post-FEC BER of $10^{-7}$ and $10^{-12}$ (extrapolated), respectively. Hence, the proposed 2-bit soft-decision front-end is an interesting low power solution for the LDPC decoders.

Within these experiments On-Off Keying (OOK) was employed. The front-end for processing binary phase shift keying (BPSK) would be the same, i.e. the hard decision threshold is chosen midway between the two points in the constellation. If the probability density function (PDF) for the +1 and −1 are symmetrical, 0 can be chosen as the hard decision threshold and the other thresholds are placed on both sides of the hard-decision threshold with no change in the front-end architecture. In the case of an unsymmetrical PDF the thresholds must be tuned for optimum decoding performance. For the soft-decision decoder any higher constellation or modulation format can be broken in to a system in which the threshold resides between two points of the constellation. For example in quadrature phase shift keying (QPSK) or 4-quadrature amplitude modulation (QAM) constellation can be broken into two BPSK systems and processed by the front-end. In such cases the expected NCG will remain the same since the Q-factor is measured for the signal just before the decoder.

Figure 1B:
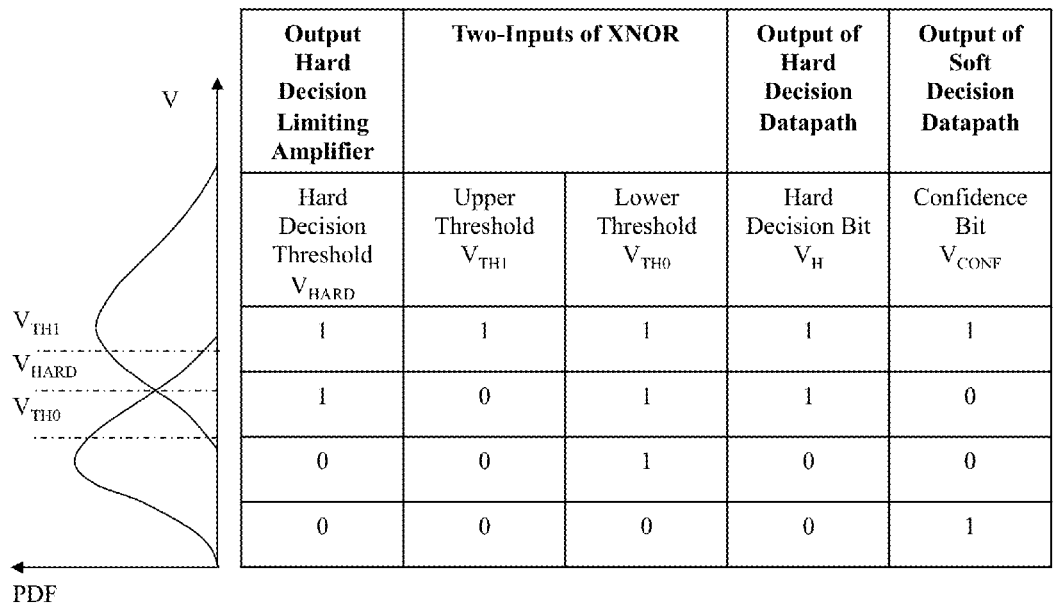
FIG. 1B depicts a logic table for hard and soft decisions.

32 GS/S 2-Bit Flash ADC Performance:

The proposed 2-bit flash ADC of FIG. 1B is quite suitable for optoelectronic integration using CMOS photonics, see Guckenberger for example, because of its linear, wide bandwidth and simpler operation. Very low complexity adaptive FIR equalizers can also be implemented and integrated with the front-end, see for example Chen et al in "A Fully-Integrated 40 Gb/s Transceiver in 65 nm CMOS Technology" (J. Solid State Circuits, Vol. 47, pp. 627-640), which will help to increase bandwidth and compensate for the link response. The adaptive equalizer in this specification uses a least mean square algorithm for setting tap coefficients dynamically and is implemented in MATLAB, see for example Haykin and Chen. The equalized post-FEC performance for 50% (672, 336), 75% (672, 504), 87.5% (672, 588) and 93.3% (1440, 1344) rate codes are presented.

Figure 17:
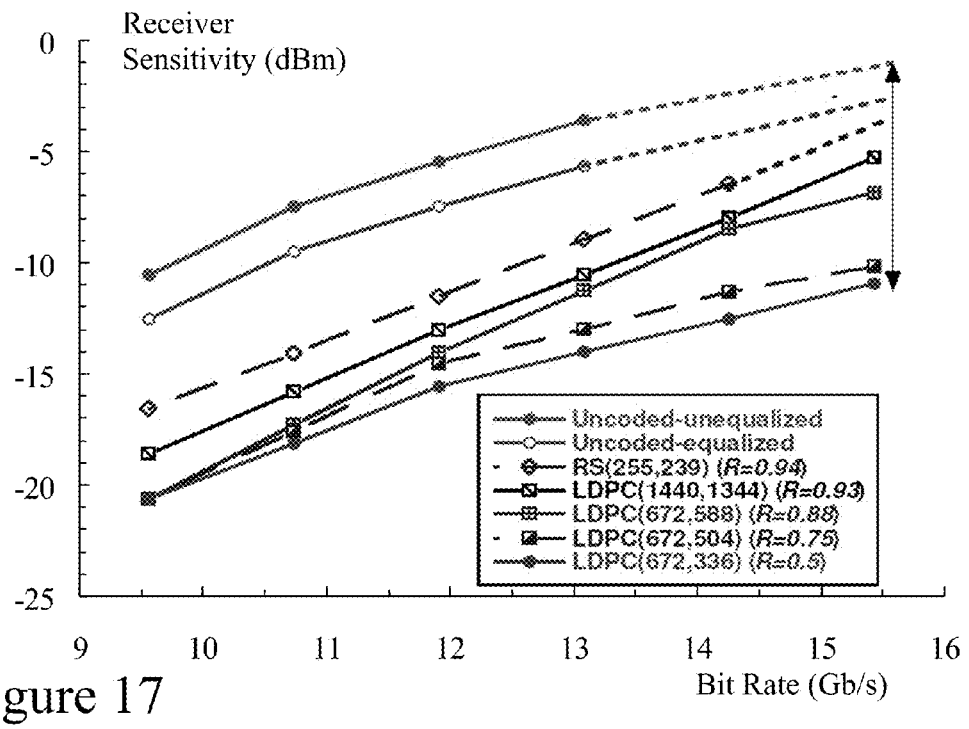
FIG. 17 depicts decoding performance of the soft-decision circuit according to an embodiment of the invention as depicted in FIG. 14A.

Measured receiver sensitivities at the BER of $10^{-7}$ (~50 independent trials over $10^7$ bits) is presented in FIG. 17 as a function of bit rate ranging from 10 Gb/s to 15 Gb/s. The horizontal axis in FIG. 6 includes the losses due to the overhead. The transmission distance was fixed at 500 m. The FIR equalizer provides 2 dB improvements in the receiver power sensitivity. FIG. 17 also shows that the receiver sensitivity is quite sensitive to bit rate and has a big impact on overall FEC performance especially at low received optical powers. It is observed that beyond −15 dBm, stronger error correction codes will not necessarily improve performance. Indeed, at lower optical power the performance is limited by the OSNR of the received signal such that the power penalty from the coding overhead (−10 log(R)) exceeds the improvement obtained by coding. However, at higher optical power above the receiver sensitivity level LDPC codes prove to be quite useful. At the bit rate of 15 Gb/s using RS(255,239), LDPC (672,336), (672, 504), (672, 588), and (1440, 1344) with FIR equalizer will result in optical power saving of 3 dB, 5 dB, 7 dB, 9.5 dB and 10.5 dB, respectively when compared to the uncoded-unequalized system. LDPC(672,336), (672, 504), (672, 588), and (1440, 1344) also show received optical improvements of 7.5 dB, 6.5 dB, 4.0 dB and 2.0 dB over RS(255,239) code for 500 m of multimode optical fiber transmission.

Figure 18:
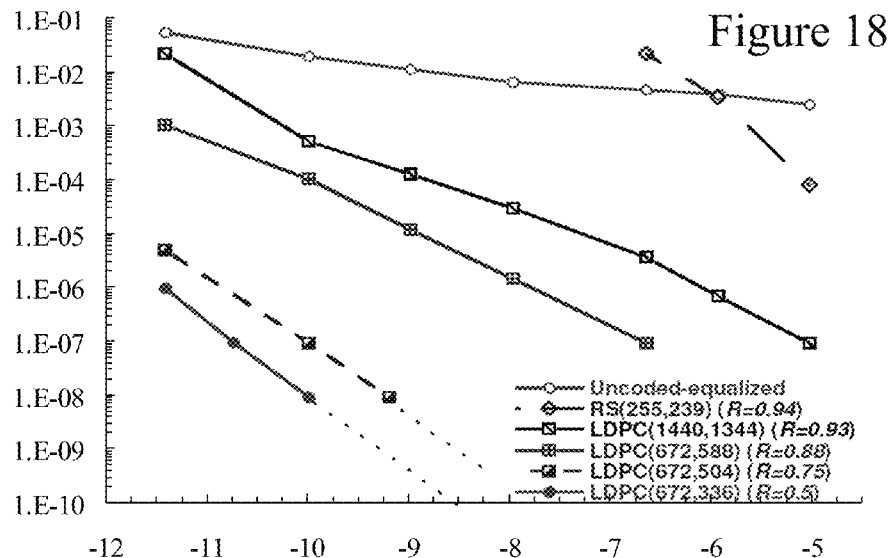
FIG. 18 depicts decoding performance of the soft-decision circuit according to an embodiment of the invention as depicted in FIG. 14A.

The experimental results at 15 Gb/s over 500 m of multimode fiber using the setup in FIG. 15B are depicted in FIG. 18 wherein the horizontal and vertical axes represent the received optical power in the hard decision branch and post-FEC BER using the confidence information from the soft decision branch, respectively. Results from FIG. 18 show that if either LDPC(672, 336) or (672, 504) is used, error free transmission ($<2 \times 10^{-9}$) is observed when the received optical power is higher than −10 dBm and −9 dBm, respectively. For LDPC (672, 588) and LDPC(1440, 1344) the best performance achieved is around BER of $10^{-7}$ at the received optical power of −6.7 dBm and −5.1 dBm, respectively. Beyond this point no errors are found in the frames captured. Another conclusion derived from FIG. 18 is that RS(255,239) fails to deliver desired performance with BER of $<8 \times 10^{-5}$ at received optical power of −5 dBm and the performance is worse than the original BER of the uncoded received signal below −6 dBm of received optical power. This is a clear indication of the suitability of the 2-bit flash ADC for decoding LDPC codes and equalization. Beyond received optical power of −11.5 dBm the performance degrades for all the coding schemes due to the loss of receiver sensitivity and low optical signal to noise ratio (OSNR) at the photodetector. These performance improvements enable a 10 Gb/s Ethernet SFP+ module specified for 300 m at −9 dBm to operate at 15 Gb/s over 500 m at −10.7 dBm of received power with LDPC and equalization.

From FIGS. 17 and 18 it is evident the LDPC(672,336) performs better than all other LDPC codes. However, the code has very low rate (50%) and high overhead. The short block codes presented showed error floors around $10^{-10}$ and are not quite suitable for long haul systems requiring BER of $10^{-12}$. But they are a very good choice for short links due to their low complexity.

Soft Decision Circuit Power Dissipation:

The power consumed by the commercial off-the-shelf components employed in the experimental soft-circuit decision circuit at 45 Gb/s are given in Table 2. The overall power consumption for 45 Gb/s soft and hard-decision branches is approximately 1.39 W. For 32 GS/s flash type ADC operation the total power consumption is 2.71 W (with 49% of the power consumed by the 1:2 selector). These power consumptions are significantly lower than the prior art, see Sakib2 and Onohara for example, which consumed 5 W at 12.5 GS/s and 14 W at 32 GS/s (with additional phase-locked clock recovery circuit), respectively.

The soft-decision circuit can be scaled to 45 GS/s by replacing the 32 GS/s 1:2 selector with a higher bandwidth circuit, e.g. a 45 Gb/s 1:4 DEMUX such as HMC848 from Hittite Microwave Corporation. Accordingly, from Table 2 the power consumed by the off-the-shelf components at 45 GS/s is also shown. The overall power consumption at 45 GS/s being 4.95 W (72% power consumed by the DEMUX). With the help of a 1:2 interleaver, see for example Micram MX2180, and two sets of the soft-decision circuit, the proposed front-end can be operated at 90 GS/s with power consumption of 14.9 W. The 90 GS/s ADC can be used for a 4×45 Gb/s coherent optical receiver to deliver two samples per bit to the digital equalizer and phase recovery circuit.

TABLE 2

Power Consumption of Soft-Decision Front-End Architectures using Off-the-Shelf Components

| Component | Power Consumed at 32 GS/S (W) | Power Consumed at 45 GS/S (W) | Power Consumed at 90 GS/S (W) |
|---|---|---|---|
| Limiting Amplifier | 3 × 0.28 (HMC866) | 3 × 0.28 (HMC866) | 6 × 0.28 (HMC866) |
| XNOR | 1 × 0.55 (HMC064) | 1 × 0.55 (HMC064) | 2 × 0.55 (HMC064) |
| DEMUX | 2 × 0.66 (HMC955) | 2 × 0.66 (HMC955) | 4 × 0.66 (HMC955) |
| 1:2 Interleaver | — | — | 1 × 5.0 (MX2180) |
| TOTAL | 2.71 | 4.95 | 14.9 |

Monolithic Optical Soft-Decision Front End

Figure 19:
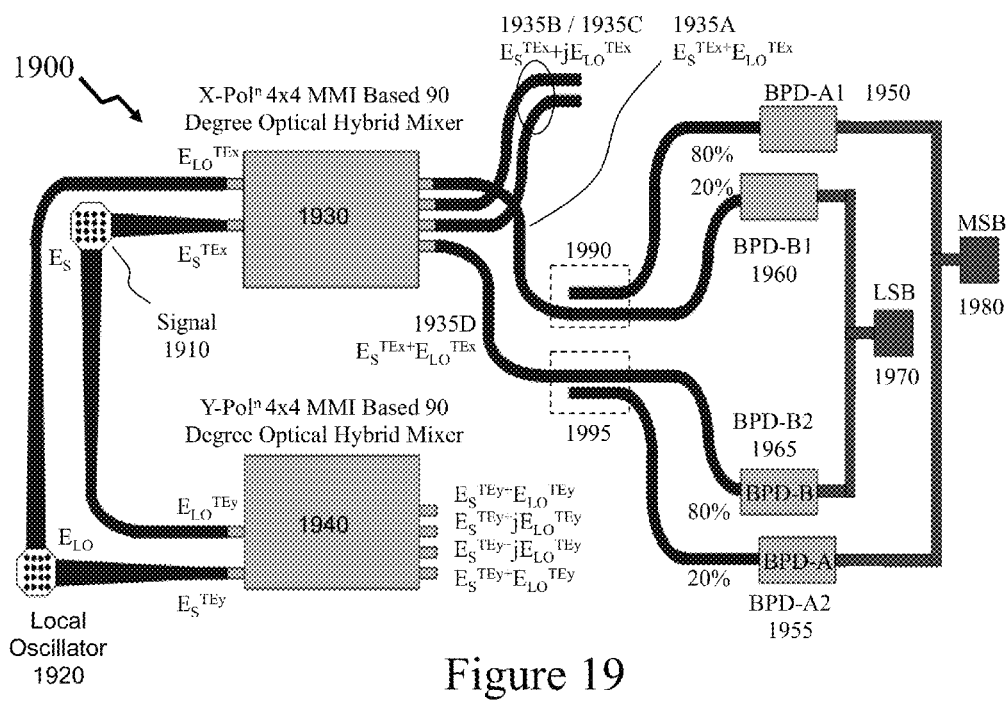
FIG. 19 depicts a monolithic soft-decision front end circuit employing silicon based photonics according to an embodiment of the invention.

Within the embodiments of the invention described supra in respect of FIGS. 2 through 12 and 14A through 18 an optical splitter couples a received optical signal to a soft-decision circuit and a hard-decision circuit. As discussed supra in respect of FIG. 13 an opto-electronic integrated circuit (OEIC) may be employed to provide the optical receiver front end and passive splitter. Referring to FIG. 19 there is depicted a coherent receiver (CR) employing a soft-decision circuit as a 2-bit Flash ADC, a CR-2FADC, exploiting monolithic integration of the directional couplers, photodetectors, and coherent receiver according to an embodiment of the invention. Such a CR-2FADC 1900 may for example be fabricated using a silicon-on-insulator (SOI) process as well as others based upon the GaAs, InP, and InGaAsP families of semiconductor for example and silicon itself.

A SOI CR-2FADC 1900 may be based upon a cross-section comprising a 2000 nm silicon dioxide ($SiO_2$) layer with a 220 nm silicon (Si) layer atop this and a 150 nm poly-Si layer above both of these. Disposed below the poly-Si between it and the Si layer is 5 nm $SiO_2$ and atop the poly-Si a 10 nm $SiO_2$ layer. As depicted first and second grating couplers 1910 and 1920 couple the signal and local oscillator optical sources to the CR-2FADC 1900 although it would be evident other means of coupling external optical sources may be employed. Each of the first and second grating couplers 1910 and 1920 respectively are coupled to first and second 4×4 Multi-Mode Interference (MMI) based 90° Optical Hybrid Mixers (MMI-9OOHM) 1930 and 1940 respectively so that orthogonal polarization components of each are coupled to different MMI-9OOHM devices. For simplicity the subsequent optical circuit from only first MMI-9OOHM 1930 are depicted although it would evident to one skilled in the art that the optical circuit may be replicated to second MMI-9OOHM 1940.

Representing the input signals for the signal and local oscillator at the inputs of the first MMI-9OOHM 1930 as $E_S^{TEx}$ and $E_{LO}^{TEx}$ respectively then the outputs 1935A through 1935D of the MMI-9OOHM 1930 are $E_S^{TEx}+E_{LO}^{TEx}$; $E_S^{TEx}+jE_{LO}^{TEx}$; $E_S^{TEx}+jE_{LO}^{TEx}$; and $E_S^{TEx}+E_{LO}^{TEx}$ respectively. Accordingly, first and fourth outputs 1935A and 1935D are depicted coupled to first and second directional couplers 1990 and 1995 respectively which split each signal by ratio 80:20. Accordingly, the 80% outputs from first and second directional couplers 1990 and 1995 respectively are coupled to first and second broadband photodetectors (BPD-A1 and BPD-A2) 1950 and 1955 respectively whilst the 20% outputs are coupled to third and fourth broadband photodetectors (BPD-B1 and BPD-B2) 1960 and 1965 respectively. The electrical outputs of the first and second broadband photodetectors (BPD-A1 and BPD-A2) 1950 and 1955 respectively are coupled to Most Significant Bit (MSB) Pad 1980 whilst the electrical outputs of the third and fourth broadband photodetectors (BPD-B1 and BPD-B2) 1960 and 1965 respectively are coupled to Least Significant Bit (LSB) Pad 1970. Accordingly, the optical and electrical circuits represented by elements 1950 through 1995 on the first and fourth outputs 1935A and 1935D may be replicated on the second and third outputs 1935B and 1935C respectively of MMI-9OOHM 1930.

Figure 20:
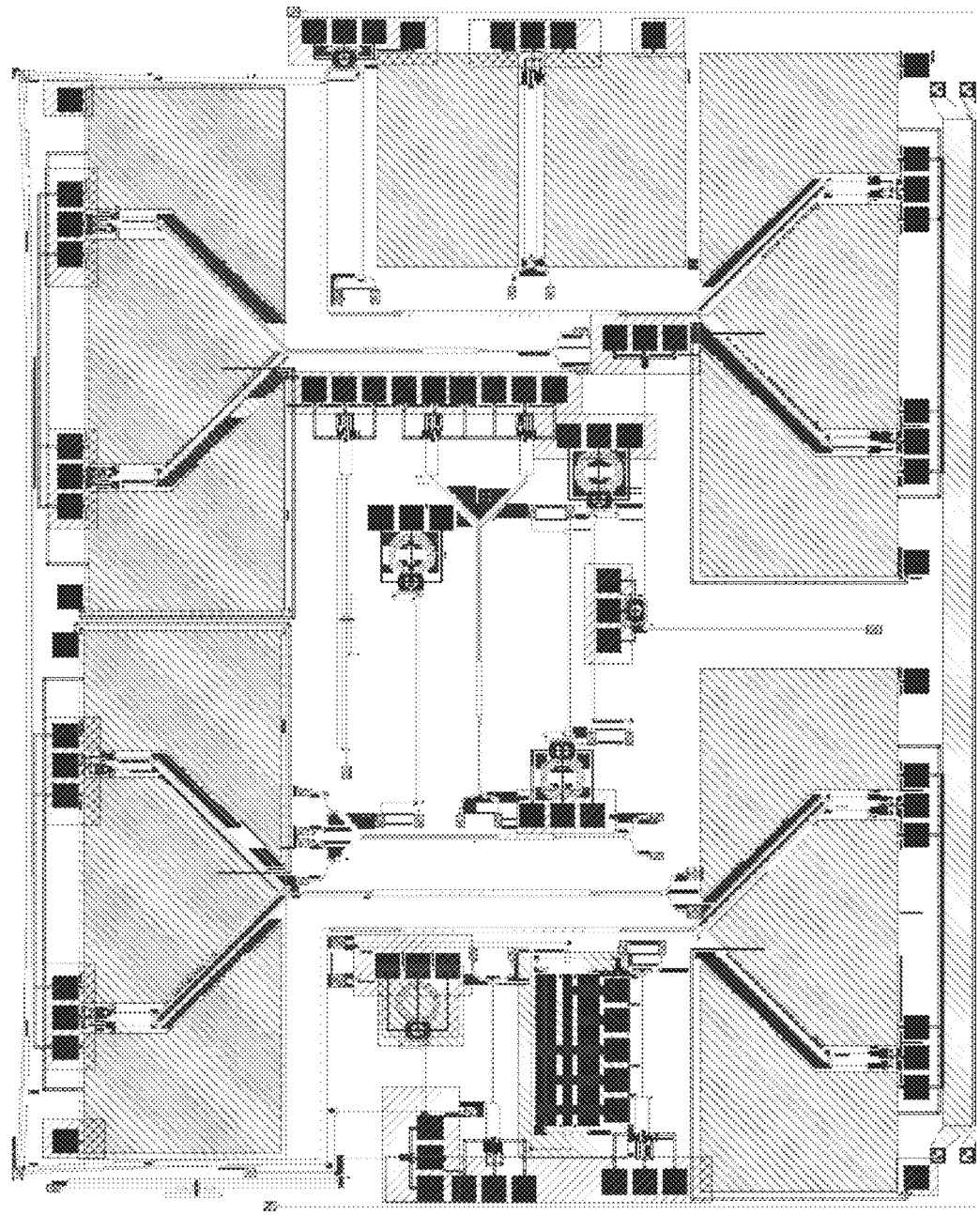
FIG. 20 depicts a system-on-chip solution to a decision circuit according to an embodiment of the invention incorporating integrated silicon photonics and electronics.

Referring to FIG. 20 there is depicted a schematic of an active silicon photonic circuit implementation of a soft-decision circuit. The resulting 4 mm by 3.5 mm circuit comprises an approximately 2 mm by 1.2 mm optical chip in the central portion with the remainder of the circuit being absorbed primarily by biasing capacitors. However it would be evident to one skilled in the art that the active silicon photonics implementation of the soft-decision circuit as depicted and described in respect of FIGS. 2 through 20 may be integrated into more complex electronic circuits including, for example, implementing FIG. 20 as part of the CR-2FADC 1900, high speed DMUX, signal processing etc and interface to other electronics, e.g. Field Programmable Gate Arrays (FPGA), to process the LDPC codes.

Within the embodiments described above it would be evident that the soft decision circuit has been described with respect to two confidence levels and that the hard decision circuit has been described with respect to a single decision. It would be evident that alternative configurations with increased numbers of confidence levels and decisions would be possible without departing from the scope of the invention. Further whilst the embodiments have been described with respect to LPDC codes it would be apparent that the approach of soft and hard decisions within receivers may be applied to other transmission formats including encoded and uncoded data. Additionally whilst the embodiments have been described in respect of optical transmission and reception the soft-decision and hard-decision circuit methodology on the converted electrical signals may be applied to a variety of other systems including those based upon wired and wireless communications. Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A circuit comprising:
   a photodetector receiving an optical signal comprising data encoded according to a predetermined standard;
   an amplifier receiving a converted optical signal from the photodetector and generating an amplified received signal;
   a fan-out buffer for receiving the amplified received signal and generating a plurality of buffered signals, each buffered signal representative of the amplified received signal;
   a plurality of first comparators, each first comparator receiving a buffered signal of the plurality of buffered signals and generating a confidence level in dependence upon the buffered signal of the plurality of buffered signals and a predetermined threshold value;
   a logic circuit receiving a plurality of confidence levels from the plurality of first comparators and generating a result in dependence thereof;
   an optical splitter to receive the optical signal and to split the optical signal into a first predetermined portion for coupling to the photodetector and a second predetermined portion for coupling to a hard decision circuit;
   the hard decision circuit comprising:
      a second photodetector for receiving the second predetermined portion of the optical signal;
      a second amplifier receiving a converted optical signal from the second photodetector and generating a second amplified received signal;

a second comparator for generating a decision in dependence upon the second amplified received signal and a predetermined decision threshold;

a delay line for delaying an output of the second comparator by a predetermined time delay; and an output decision circuit for receiving the result from the logic circuit and the delayed output of the comparator within the hard decision circuit.

2. The circuit according to claim 1, further comprising:

an optical splitter to receive the optical signal and to split the optical signal into a first predetermined portion for coupling to the photodetector and a second predetermined portion for coupling to a hard decision circuit.

3. The circuit according to claim 1, further comprising:

a decision circuit for receiving the result from the logic circuit and a decision from a hard decision circuit also receiving the optical signal and generating a logical output in dependence therefrom.

4. The circuit according to claim 1, further comprising;

a second photodetector receiving another optical signal comprising data encoded according to a predetermined standard, wherein the optical signal and another optical signal are generated as outputs from a predetermined portion of a coherent receiver and outputs of the photodetector and second photodetector are combined in a predetermined manner to generate the converted optical signal.

5. The circuit according to claim 1, wherein the logic circuit result represents outputs of a 2-bit flash analog-to-digital converter which is representative of a digital representation of the received optical signal.

6. The circuit according to claim 1, wherein the result from the logic circuit and the delayed output of the comparator within the hard decision circuit are multiplexed by a multiplexer for provisioning to the output decision circuit.

7. A circuit comprising:

an optical front end comprising:

an optical splitter receiving an optical signal comprising data encoded according to a predetermined standard from a network and splitting the received optical signal into a first predetermined portion and a second predetermined portion;

a first photodetector coupled to the optical splitter and receiving the first predetermined portion of the received optical signal;

a second photodetector coupled to the optical splitter and receiving the second predetermined portion of the received optical signal;

a soft decision circuit comprising:

an amplifier receiving a converted optical signal from the first photodetector and generating a first amplified received signal;

a fan-out buffer for receiving the first amplified received signal and generating a plurality of buffered signals, each buffered signal representative of the first amplified received signal;

a plurality of first comparators, each first comparator receiving a buffered signal of the plurality of buffered signals and generating a confidence level in dependence upon the buffered signal of the plurality of buffered signals and a predetermined threshold value; and a logic circuit receiving a plurality of confidence levels from the plurality of first comparators and generating a result in dependence thereof;

a hard decision circuit comprising:

a second amplifier receiving a converted optical signal from the second photodetector and generating a second amplified received signal;

a second comparator for generating a decision in dependence upon the second amplified received signal and a predetermined decision threshold;

a delay line for delaying the output of the second comparator by a predetermined time delay; and an output decision circuit receiving the result from the logic circuit within the soft decision circuit and the delayed output of the comparator within the hard decision circuit and generating a logical output in dependence therefrom.

8. The circuit according to claim 7, wherein the result from the logic circuit within the soft decision circuit and the delayed output of the comparator within the hard decision circuit are multiplexed by a multiplexer for provisioning to the output decision circuit.

9. The circuit according to claim 7, wherein the optical front end is a monolithic optical circuit.

* * * * *